(12) United States Patent
Tataurova et al.

(10) Patent No.: US 12,415,906 B2
(45) Date of Patent: Sep. 16, 2025

(54) RESIN COMPOSITION AND FLOW CELLS INCORPORATING THE SAME

(71) Applicant: ILLUMINA, INC., San Diego, CA (US)

(72) Inventors: Yulia N. Tataurova, San Diego, CA (US); Timothy J. Merkel, San Diego, CA (US)

(73) Assignee: Illumina, Inc., San Diego, CA (US)

( * ) Notice: Subject to any disclaimer, the term of this patent is extended or adjusted under 35 U.S.C. 154(b) by 886 days.

(21) Appl. No.: 17/666,289

(22) Filed: Feb. 7, 2022

(65) Prior Publication Data

US 2022/0259406 A1    Aug. 18, 2022

Related U.S. Application Data

(60) Provisional application No. 63/147,605, filed on Feb. 9, 2021.

(51) Int. Cl.
| | | |
|---|---|---|
| C08K 9/04 | (2006.01) | |
| C08K 3/36 | (2006.01) | |
| G01N 15/1434 | (2024.01) | |
| G03F 7/00 | (2006.01) | |
| G01N 15/10 | (2006.01) | |

(52) U.S. Cl.
CPC .................. *C08K 9/04* (2013.01); *C08K 3/36* (2013.01); *G01N 15/1436* (2013.01); *G03F 7/0002* (2013.01); *G01N 2015/1006* (2013.01)

(58) Field of Classification Search
USPC .......................................................... 528/103
See application file for complete search history.

(56) References Cited

U.S. PATENT DOCUMENTS

| | | |
|---|---|---|
| 8,530,539 B2 | 9/2013 | Miyake et al. |
| 2007/0282030 A1 | 12/2007 | Anderson et al. |
| 2020/0025670 A1 | 1/2020 | Merkel et al. |

FOREIGN PATENT DOCUMENTS

| | | | | |
|---|---|---|---|---|
| EP | 2868692 A1 | 5/2015 | | |
| WO | WO-2015023640 A1 | * 2/2015 | .............. | C08J 5/005 |

* cited by examiner

*Primary Examiner* — Terressa Boykin
(74) *Attorney, Agent, or Firm* — Dierker & Kavanaugh, P.C.

(57) ABSTRACT

An example of a resin composition includes an epoxy resin matrix and functionalized silica nanoparticles incorporated into the epoxy resin matrix. The functionalized silica nanoparticles have an average particle size up to about 10 nm. The resin composition is imprintable using nanoimprint lithography. The resin composition may be used to manufacture a patterned substrate for a flow cell.

15 Claims, 8 Drawing Sheets

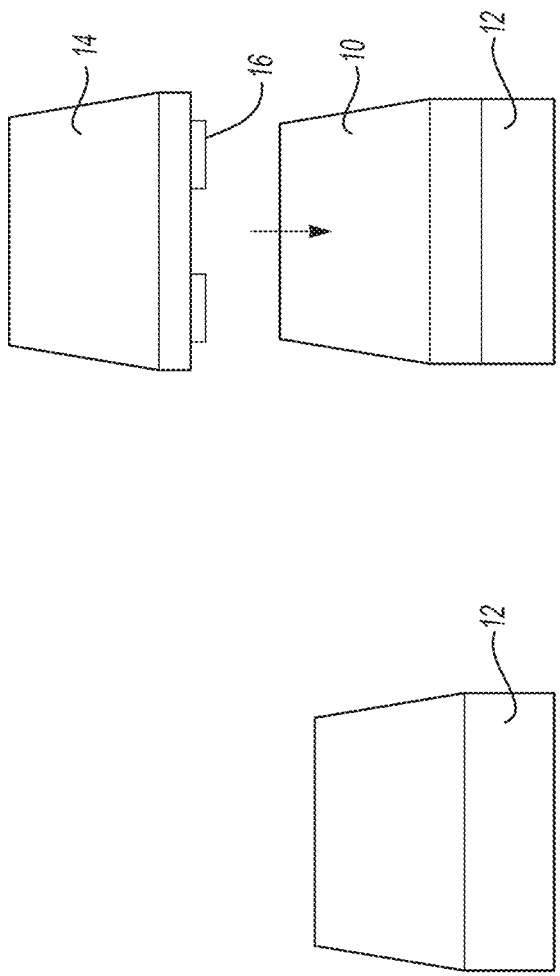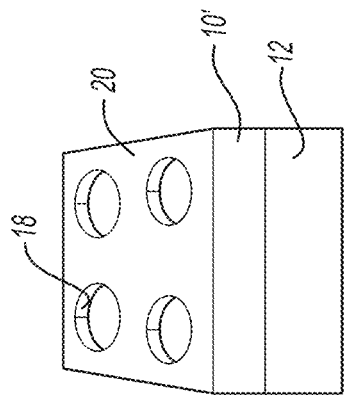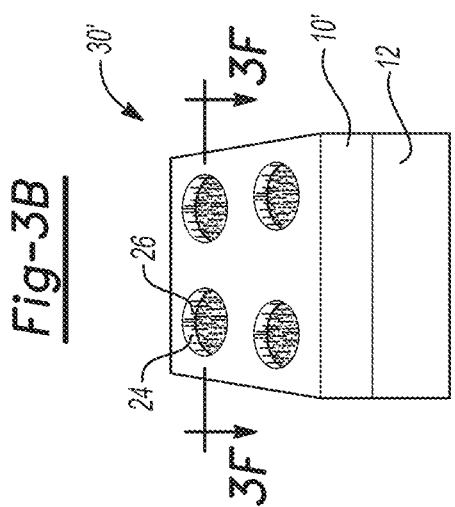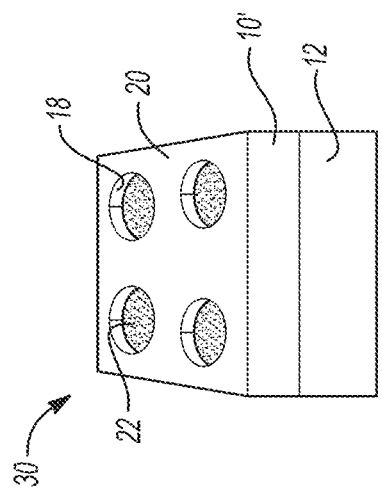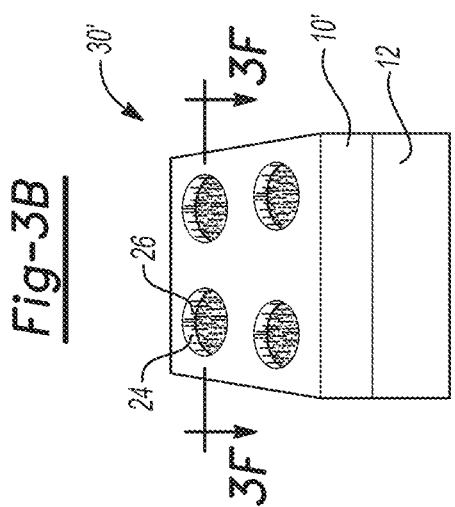

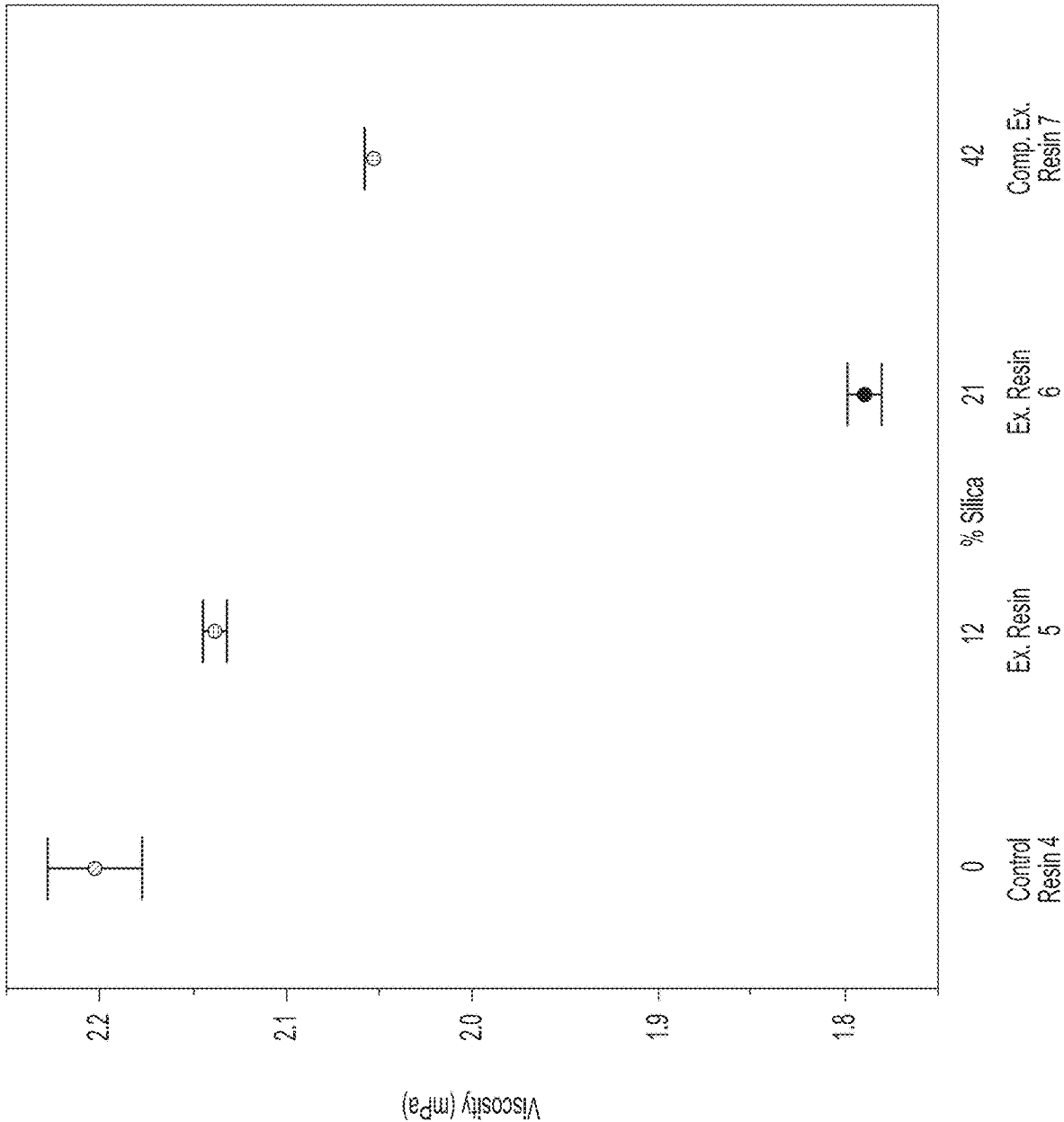

RESIN COMPOSITION AND FLOW CELLS INCORPORATING THE SAME

CROSS-REFERENCE TO RELATED APPLICATION

This application claims the benefit of U.S. Provisional Application Ser. No. 63/147,605, filed Feb. 9, 2021, the contents of which is incorporated by reference herein in its entirety.

BACKGROUND

Nanoimprinting technology enables the economic and effective production of nanostructures. Nanoimprint lithography employs direct mechanical deformation of material by a stamp having nanostructures. The material is cured while the stamp is in place to lock the shape of the nanostructures in the material.

Nanoimprint lithography has been used to manufacture patterned substrates, which may be used in a variety of applications. Some patterned substrates include fluidic channels and discrete wells or depressions. These patterned substrates may be built into flow cells. In some flow cells, active surface chemistry is introduced into the discrete depressions, while interstitial regions surrounding the discrete depressions remain inert. These flow cells may be particularly useful for detection and evaluation of a wide range of molecules (e.g., DNA), families of molecules, genetic expression levels, or single nucleotide polymorphisms.

SUMMARY

Disclosed herein is a resin composition, which is suitable for use in nanoimprint lithography. Examples of the resin composition include an epoxy resin matrix and functionalized silica nanoparticles. The particular size and amount of the functionalized silica nanoparticles in the epoxy resin matrix contribute to the imprintability of the resin composition. Examples of the resin composition exhibit a consistently high extent of cure in under 30 seconds.

A cured resin generated with an example of the resin composition may have several desirable properties. As one example, the cured resin may have a high hardness level, which enhances the resin's resistance to damage during subsequent processing. As another example, the cured resin may exhibit low autofluorescence. As still another example, the cured resin may exhibit reduced cracking and disaggregation.

In a first aspect, a resin composition comprises an epoxy resin matrix; and functionalized silica nanoparticles incorporated into the epoxy resin matrix In an example of the first aspect, the functionalized silica nanoparticles having an average particle size up to about 10 nm.

In an example of the first aspect, the functionalized silica nanoparticles have surface functional groups, and the surface functional groups are selected from the group consisting of acrylic functional groups, carboxy functional groups, amino functional groups, and combinations thereof.

In an example of the first aspect, the functionalized silica nanoparticles are present in an amount ranging from greater than 0 mass % up to about 35 mass %, based on total solids in the resin composition.

In an example of the first aspect, the functionalized silica nanoparticles are present in an amount ranging from about 12 mass % to about 25 mass %, based on total solids in the resin composition.

In an example of the first aspect, the epoxy resin matrix comprises one or more epoxy materials selected from the group consisting of an epoxy functionalized silsesquioxane, trimethylolpropane triglycidyl ether, tetrakis(epoxycyclohexyl ethyl)tetramethyl cyclotetrasiloxane, a copolymer of (epoxycyclohexylethyl)methylsiloxane and dimethylsiloxane, 1,3-bis[2-(3,4-epoxycyclohexyl) ethyl] tetramethyl disiloxane, 1,3-bis(glycidoxypropyl)tetramethyl disiloxane, 3,4-epoxycyclohexylmethyl-3,4-epoxycyclo-hexanecarboxylate, bis((3,4-epoxycyclohexyl)methyl) adipate, 4-vinyl-1-cyclohexene 1,2-epoxide, vinylcyclohexene dioxide, 4,5-epoxytetrahydrophthalic acid diglycidylester, 1,2-epoxy-3-phenoxypropane, glycidyl methacrylate, 1,2-epoxyhexadecane, poly(ethylene glycol) diglycidylether, pentaerythritol glycidyl ether, diglycidyl 1,2-cyclohexanedicarboxylate, tetrahydrophthalic acid diglycidyl ester, and combinations thereof.

An example of the first aspect further comprises a liquid carrier.

It is to be understood that any features of the first aspect of the resin composition disclosed herein may be combined together in any desirable manner and/or configuration to achieve the benefits as described in this disclosure, including, for example, improved mechanical properties and/or an increased extent of cure.

In a second aspect, a resin composition comprises a liquid carrier with solids dispersed in the liquid carrier, the solids consisting of: an epoxy material selected from the group consisting of an epoxy functionalized silsesquioxane, trimethylolpropane triglycidyl ether, tetrakis(epoxycyclohexyl ethyl)tetramethyl cyclotetrasiloxane, a copolymer of (epoxycyclohexylethyl)methylsiloxane and dimethylsiloxane, 1,3-bis[2-(3,4-epoxycyclohexyl) ethyl] tetramethyl disiloxane, 1,3-bis(glycidoxypropyl)tetramethyl disiloxane, 3,4-epoxycyclohexylmethyl-3,4-epoxycyclo-hexanecarboxylate, bis((3,4-epoxycyclohexyl)methyl) adipate, 4-vinyl-1-cyclohexene 1,2-epoxide, vinylcyclohexene dioxide, 4,5-epoxytetrahydrophthalic acid diglycidylester, 1,2-epoxy-3-phenoxypropane, glycidyl methacrylate, 1,2-epoxyhexadecane, poly(ethylene glycol) diglycidylether, pentaerythritol glycidyl ether, diglycidyl 1,2-cyclohexanedicarboxylate, tetrahydrophthalic acid diglycidyl ester, and combinations thereof; functionalized silica nanoparticles; an initiating system selected from the group consisting of a direct photoacid generator and a combination of a free radical photoinitiator and a photoacid generator; and an optional surface additive.

In an example of the second aspect, the functionalized silica nanoparticles have an average particle size up to about 10 nm.

In an example of the second aspect, the epoxy material is present in an amount ranging from about 65 mass % to less than 100 mass %, based on total solids in the resin composition; and the functionalized silica nanoparticles are present in an amount ranging from greater than 0 mass % up to about 35 mass %, based on the total solids in the resin composition.

In an example of the second aspect, the functionalized silica nanoparticles have surface functional groups, and the surface functional groups are selected from the group consisting of acrylic functional groups, carboxy functional groups, amino functional groups, and combinations thereof.

It is to be understood that any features of this resin composition may be combined together in any desirable manner. Moreover, it is to be understood that any combination of features of this resin composition and/or of the first aspect of the resin composition may be used together, and/or combined with any of the examples disclosed herein to achieve the benefits as described in this disclosure, including, for example, improved mechanical properties and/or an increased extent of cure.

In a third aspect, a flow cell comprises a substrate and a cured, patterned resin on the substrate, the cured, patterned resin including depressions separated by interstitial regions, and the cured, patterned resin including a cured form of a resin composition including an epoxy resin matrix and functionalized silica nanoparticles incorporated into the epoxy resin matrix, the functionalized silica nanoparticles having an average particle size up to about 10 nm.

An example of the third aspect further comprises a hydrogel in the depressions and amplification primers attached to the hydrogel.

In an example of the third aspect, the functionalized silica nanoparticles have surface functional groups, and the surface functional groups are selected from the group consisting of acrylic functional groups, carboxy functional groups, amino functional groups, and combinations thereof.

In an example of the third aspect, the epoxy resin matrix comprises an epoxy material selected from the group consisting of an epoxy functionalized silsesquioxane, trimethylolpropane triglycidyl ether, tetrakis(epoxycyclohexyl ethyl)tetramethyl cyclotetrasiloxane, a copolymer of (epoxycyclohexylethyl)methylsiloxane and dimethylsiloxane, 1,3-bis[2-(3,4-epoxycyclohexyl) ethyl] tetramethyl disiloxane, 1,3-bis(glycidoxypropyl)tetramethyl disiloxane, 3,4-epoxycyclohexylmethyl-3,4-epoxycyclo-hexanecarboxylate, bis((3,4-epoxycyclohexyl)methyl) adipate, 4-vinyl-1-cyclohexene 1,2-epoxide, vinylcyclohexene dioxide, 4,5-epoxytetrahydrophthalic acid diglycidylester, 1,2-epoxy-3-phenoxypropane, glycidyl methacrylate, 1,2-epoxyhexadecane, poly(ethylene glycol) diglycidylether, pentaerythritol glycidyl ether, diglycidyl 1,2-cyclohexanedicarboxylate, tetrahydrophthalic acid diglycidyl ester, and combinations thereof.

It is to be understood that any features of the flow cell disclosed herein may be combined together in any desirable manner. Moreover, it is to be understood that any combination of features of the flow cell and/or of the resin composition(s) may be used together, and/or combined with any of the examples disclosed herein to achieve the benefits as described in this disclosure, including, for example, an interior flow cell surface with a substantially homogeneous coating surface.

In a fourth aspect, a method comprises mixing an epoxy resin matrix and a liquid carrier to form a mixture; and incorporating functionalized silica nanoparticles having an average particle size up to about 10 nm into the mixture, thereby forming a diluted resin composition, wherein the functionalized silica nanoparticles are present in an amount ranging from greater than 0 mass % up to about 35 mass %, based on total solids in the diluted resin composition.

An example of the fourth aspect further comprises applying the diluted resin composition on a substrate, whereby at least some of the liquid carrier evaporates to form a nanoimprintable resin composition; imprinting the nanoimprintable resin composition with a working stamp having a plurality of nanofeatures; and curing the nanoimprintable resin composition while the working stamp is in place, thereby forming a cured, patterned resin on the substrate.

In an example of the fourth aspect, the functionalized silica nanoparticles have surface functional groups, and the surface functional groups are selected from the group consisting of acrylic functional groups, carboxy functional groups, amino functional groups, and combinations thereof.

In an example of the fourth aspect, the epoxy resin matrix comprises an epoxy material selected from the group consisting of an epoxy functionalized silsesquioxane, trimethylolpropane triglycidyl ether, tetrakis(epoxycyclohexyl ethyl)tetramethyl cyclotetrasiloxane, a copolymer of (epoxycyclohexylethyl)methylsiloxane and dimethylsiloxane, 1,3-bis[2-(3,4-epoxycyclohexyl) ethyl] tetramethyl disiloxane, 1,3-bis(glycidoxypropyl)tetramethyl disiloxane, 3,4-epoxycyclohexylmethyl-3,4-epoxycyclo-hexanecarboxylate, bis((3,4-epoxycyclohexyl)methyl) adipate, 4-vinyl-1-cyclohexene 1,2-epoxide, vinylcyclohexene dioxide, 4,5-epoxytetrahydrophthalic acid diglycidylester, 1,2-epoxy-3-phenoxypropane, glycidyl methacrylate, 1,2-epoxyhexadecane, poly(ethylene glycol) diglycidylether, pentaerythritol glycidyl ether, diglycidyl 1,2-cyclohexanedicarboxylate, tetrahydrophthalic acid diglycidyl ester, and combinations thereof.

It is to be understood that any features of the method may be combined together in any desirable manner. Moreover, it is to be understood that any combination of features of the method and/or of the flow cell and/or of the resin compositions may be used together, and/or combined with any of the examples disclosed herein to achieve the benefits as described in this disclosure, including, for example, an increased extent of cure.

BRIEF DESCRIPTION OF THE DRAWINGS

Features of examples of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

FIGS. 3A through 3E are schematic perspective views which together depict an example of the method of FIG. 2;

FIG. 3F is a schematic and cross-sectional view taken along line 3F-3F of FIG. 3E;

FIG. 4 is a graph depicting the viscosity (m Pa, Y axis) of diluted resin compositions versus the percentage of functionalized silica nanoparticles (mass % solids, X axis) in the diluted resin compositions;

DETAILED DESCRIPTION

Figure 1:
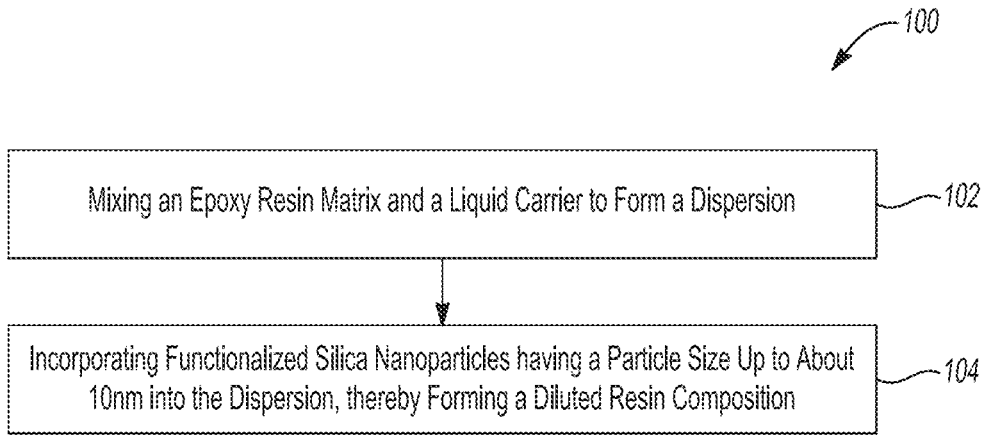
FIG. 1 is a flow diagram illustrating an example of a method for making an example of a diluted resin composition disclosed herein.

Some patterned flow cells include a resin material that has discrete wells or depressions formed therein. To form the wells or depressions, the resin material may be imprinted using a variety of techniques, such as nanoimprint lithography. Nanoimprint lithography involves imprinting a resin with an imprinting apparatus (e.g., a template or working stamp), and then curing the resin. When nanoimprinting is successful, features of the imprinting apparatus are transferred to the resin.

Disclosed herein is a resin composition that is suitable for use in nanoimprint lithography. The resin composition includes a particular amount of functionalized silica nanoparticles, which have a particular average particle size. As demonstrated in the example section set forth herein, when these specific functionalized silica nanoparticles are included in the specific amounts, the viscosity of the diluted resin composition stays within a range that enables the diluted resin composition to be deposited, and the deposited resin composition has a desired film thickness and is able to be successfully nanoimprinted (e.g., features of the template are transferred to the cured resin with precision and accuracy).

The addition of the functionalized silica nanoparticles does not deleteriously affect the extent of cure (e.g., polymerization and/or crosslinking) of the monomers or polymers in the resin composition. Resins that are under-cured are not fully vitrified and can exhibit reflow, which may manifest in a poor and uncontrolled well/depression shape in the patterned area. Additionally, under-cured resins may have low hardness values, which can increase the material's sensitivity to downstream processing. Fourier-transform infrared spectroscopy (FTIR) intensity at 2990 cm$^{-1}$ shows that a correlation exists between the hardness of the cured resin and the extent of cure. A higher extent of cure corresponds with a lower corrected intensity at 2990 cm$^{-1}$.

As demonstrated in the example section set forth herein, examples of the resin composition disclosed herein exhibit a consistently high extent of cure in under 30 seconds. The extent of cure is reduced, and the corrected intensity at 2990 cm$^{-1}$ is increased, when the amount functionalized silica nanoparticles exceeds the upper limit disclosed herein. However, when the functionalized silica nanoparticles are included in the specific amounts disclosed herein, the resin composition effectively cures, as evidenced by a low corrected intensity at 2990 cm$^{-1}$ and an increase in the hardness of the cured resin. The high hardness level reduces the cured resin's sensitivity to downstream processing, and thus the cured patterned resin exhibits enhanced resistance to damage (e.g., scratching) during subsequent processing, such as polishing. As the hardness of examples of the cured resin disclosed herein is at a desirable level (e.g., at least 0.25 GPa with a 20 second cure time, or at least 0.175 GPa with a 5 second cure time), the potential for reflow and scratching to occur is minimal or non-existent.

The suitable extent of cure and increased hardness are coupled with the fact that other desirable properties of the cured resin, such as low autofluorescence, are not deleteriously affected. Some cured resins exhibit undesirable levels of autofluorescence at excitation wavelengths of interest (e.g., violet excitation wavelengths ranging from about 380 nm to about 450 nm, or blue excitation wavelengths ranging from about 450 nm to about 495 nm, or green excitation wavelengths ranging from about 495 nm to about 570 nm). Fluorescence from the cured resin can increase the background noise when imaging optical labels of nucleotides that have been incorporated into individual nascent strands formed in the depressions during sequencing. Increased background noise can decrease signal to noise ratios (SNRs) so that signals from individual clusters within individual depressions are more difficult to be resolved during sequencing. The examples of the cured resin disclosed herein have minimal absorbance of blue excitation, resulting in relatively low or no blue or longer wavelength autofluorescence when exposed to violet or blue excitation wavelengths. As such, the potential for signal interference during sequencing on a patterned flow cell surface of examples of the cured resin disclosed herein is minimal or non-existent.

The functionalized silica nanoparticles may also fill cavities within the cured pattern resin, which can reduce cracking. The functionalized silica nanoparticles can also prevent epoxy disaggregation during curing, which can lead to a more homogeneous coating, which, in turn, can reduce blistering or delamination of subsequently deposited materials.

As such, the resin composition disclosed herein can have the benefit of significantly increasing the throughput of patterned flow cell manufacturing, without compromising the desired properties of the corresponding cured resin.

Definitions

It is to be understood that terms used herein will take on their ordinary meaning in the relevant art unless specified otherwise. Several terms used herein and their meanings are set forth below.

The singular forms "a", "an", and "the" include plural referents unless the context clearly dictates otherwise.

The terms comprising, including, containing and various forms of these terms are synonymous with each other and are meant to be equally broad.

The terms top, bottom, lower, upper, on, adjacent, etc. are used herein to describe the flow cell and/or the various components of the flow cell. It is to be understood that these directional terms are not meant to imply a specific orientation, but are used to designate relative orientation between components. The use of directional terms should not be interpreted to limit the examples disclosed herein to any specific orientation(s).

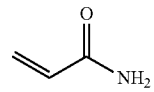

An "acrylamide" is a functional group with the structure or a monomer including an acrylamide functional group. An acrylamide may be the chemical compound acrylamide with a substituent in place of one or more hydrogen atoms (e.g., methacrylamide). Examples of the monomer including an acrylamide functional group include azido acetamido pentyl acrylamide:

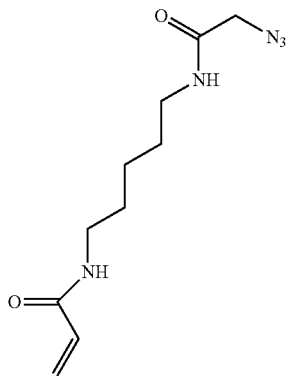 [SMILES: C=CC(=O)NCCCCCNC(=O)CN=[N+]=[N-]]

and N-isopropylacrylamide:

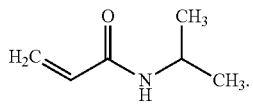

Other acrylamide monomers may be used, some examples of which are set forth herein.

An "aldehyde," as used herein, is an organic compound containing a functional group with the structure —CHO, which includes a carbonyl center (i.e., a carbon double-bonded to oxygen) with the carbon atom also bonded to hydrogen and an R group, such as an alkyl or other side chain. The general structure of an aldehyde is:

As used herein, "alkyl" refers to a straight or branched hydrocarbon chain that is fully saturated (i.e., contains no double or triple bonds). The alkyl group may have 1 to 20 carbon atoms. Example alkyl groups include methyl, ethyl, propyl, isopropyl, butyl, isobutyl, tertiary butyl, pentyl, hexyl, and the like. As an example, the designation "C1-C4 alkyl" indicates that there are one to four carbon atoms in the alkyl chain, i.e., the alkyl chain is selected from the group consisting of methyl, ethyl, propyl, iso-propyl, n-butyl, isobutyl, sec-butyl, and t-butyl. An alkyl may be substituted or unsubstituted. An example of a substituted alkyl is a haloalkyl, or an alkyl substituted with a halogen.

As used herein, "alkenyl" refers to a straight or branched hydrocarbon chain containing one or more double bonds. The alkenyl group may have 2 to 20 carbon atoms. Example alkenyl groups include ethenyl, propenyl, butenyl, pentenyl, hexenyl, and the like.

An "alkoxy" group refers to the formula —OR, wherein R is an alkyl, an alkenyl, an alkynyl, a cycloalkyl, a cycloalkenyl or a cycloalkynyl as defined herein. Some example alkoxy groups include methoxy, ethoxy, n-propoxy, 1-methylethoxy (isopropoxy), n-butoxy, iso-butoxy, sec-butoxy, and tert-butoxy. Any alkoxy may be substituted or unsubstituted.

As used herein, "alkyne" or "alkynyl" refers to a straight or branched hydrocarbon chain containing one or more triple bonds. The alkynyl group may have 2 to 20 carbon atoms.

An "aralkyl" refers to an aryl substituted alkyl radical.

As used herein, "aryl" refers to an aromatic ring or ring system (i.e., two or more fused rings that share two adjacent carbon atoms) containing only carbon in the ring backbone. When the aryl is a ring system, every ring in the system is aromatic. The aryl group may have 6 to 18 carbon atoms. Examples of aryl groups include phenyl, naphthyl, azulenyl, and anthracenyl.

An "amine" or "amino" functional group refers to an —$NR_aR_b$ group, where $R_a$ and $R_b$ are each independently selected from hydrogen (e.g., 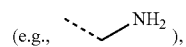), C1-C6 alkyl, C2-C6 alkenyl, C2-C6 alkynyl, C3-C7 carbocycle, C6-C10 aryl, 5-10 membered heteroaryl, and 5-10 membered heterocycle, as defined herein.

As used herein, the term "attached" refers to the state of two things being joined, fastened, adhered, connected or bound to each other, either directly or indirectly. For example, a nucleic acid can be attached to a polymer hydrogel by a covalent or non-covalent bond. A covalent bond is characterized by the sharing of pairs of electrons between atoms. A non-covalent bond is a physical bond that does not involve the sharing of pairs of electrons and can include, for example, hydrogen bonds, ionic bonds, van der Waals forces, hydrophilic interactions and hydrophobic interactions.

"Autofluorescence" refers to the emission of light by the cured resin when exposed to blue excitation wavelengths. No autofluorescence means that the level of fluorescence is below a threshold limit of detection. The term "low autofluorescence" refers to the emission level (of the cured resin when exposed to blue excitation wavelengths) being above the threshold limit of detection and being low enough to be considered noise, and the noise being at a level that does not interfere with the identification of cluster signals during sequencing (e.g., the levels of autofluorescence enable signal to noise ratios (SNRs) that are high enough so that signals from individual clusters can be resolved during sequencing).

It is to be understood that the definition of "low" or "low level", in terms of quantifying the autofluorescence (AF), may vary depending upon the tool used to measure the autofluorescence and/or lamps used to provide the excitation radiation. In some examples, a reference may be used to define the relative AF level. As one example, the reference is the AF level of 0.7 mm thick CORNING® EAGLE XG® glass (CEXG), and a "low AF" can be defined relative to the CEXG output with blue laser excitation. The numerical value of this output (in arbitrary units) is relevant in a relative sense, as it may depend on the material being measured, the excitation and emission bands being measured, the intensity of exciting light, etc. As an example, given emission values of about 3500 AU for 0.7 mm CEXG, an approximately 500 nm layer of the cured resin may be considered to have low AF if the total signal from the stack is less than about 10,000 AU (e.g., cured resin contribution is less than 2× the CEXG contribution), or in other examples, less than about 7,000 AU (e.g., cured resin contribution is less than 1×CEXG contribution).

An "azide" or "azido" functional group refers to —$N_3$.

As used herein, "carbocycle" means a non-aromatic cyclic ring or ring system containing only carbon atoms in the ring system backbone. When the carbocycle is a ring system, two or more rings may be joined together in a fused, bridged or spiro-connected fashion. Carbocycles may have any degree of saturation, provided that at least one ring in a ring system is not aromatic. Thus, carbocycles include cycloalkyls, cycloalkenyls, and cycloalkynyls. The carbocycle group may have 3 to 20 carbon atoms. Examples of carbocycle rings include cyclopropyl, cyclobutyl, cyclopentyl, cyclohexyl, cyclohexenyl, 2,3-dihydro-indene, bicyclo[2.2.2]octanyl, adamantyl, and spiro[4.4]nonanyl.

As used herein, "cycloalkenyl" or "cycloalkene" means a carbocycle ring or ring system having at least one double bond, wherein no ring in the ring system is aromatic. Examples include cyclohexenyl or cyclohexene and norbornenyl or norbornene. Also as used herein, "heterocycloalkenyl" or "heterocycloalkene" means a carbocycle ring or ring system with at least one heteroatom in ring backbone, having at least one double bond, wherein no ring in the ring system is aromatic.

As used herein, "cycloalkyl" refers to a completely saturated (no double or triple bonds) mono- or multi-cyclic hydrocarbon ring system. When composed of two or more rings, the rings may be joined together in a fused fashion. Cycloalkyl groups can contain 3 to 10 atoms in the ring(s). In some embodiments, cycloalkyl groups can contain 3 to 8 atoms in the ring(s). A cycloalkyl group may be unsubstituted or substituted. Example cycloalkyl groups include cyclopropyl, cyclobutyl, cyclopentyl, cyclohexyl, cycloheptyl, and cyclooctyl.

As used herein, "cycloalkynyl" or "cycloalkyne" means a carbocycle ring or ring system having at least one triple bond, wherein no ring in the ring system is aromatic. An example is cyclooctyne. Another example is bicyclononyne. Also as used herein, "heterocycloalkynyl" or "heterocycloalkyne" means a carbocycle ring or ring system with at least one heteroatom in ring backbone, having at least one triple bond, wherein no ring in the ring system is aromatic.

The term "depositing," as used herein, refers to any suitable application technique, which may be manual or automated, and, in some instances, results in modification of the surface properties. Depositing may be performed using vapor deposition techniques, coating techniques, grafting techniques, or the like. Some specific examples include chemical vapor deposition (CVD), spray coating (e.g., ultrasonic spray coating), spin coating, dunk or dip coating, doctor blade coating, puddle dispensing, flow through coating, aerosol printing, screen printing, microcontact printing, inkjet printing, or the like.

As used herein, the term "depression" refers to a discrete concave feature in a patterned resin having a surface opening that is at least partially surrounded by interstitial region(s) of the cured resin. Depressions can have any of a variety of shapes at their opening in a surface including, as examples, round, elliptical, square, polygonal, star shaped (with any number of vertices), etc. The cross-section of a depression taken orthogonally with the surface can be curved, square, polygonal, hyperbolic, conical, angular, etc. As examples, the depression can be a well or a trench/line/trough. The depression may also have more complex architectures, such as ridges, step features, etc.

The term "each," when used in reference to a collection of items, is intended to identify an individual item in the collection, but does not necessarily refer to every item in the collection. Exceptions can occur if explicit disclosure or context clearly dictates otherwise.

The term "epoxy" as used herein refers to

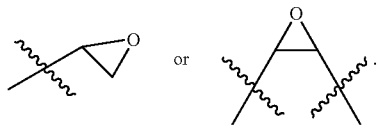

As used herein, the term "flow cell" is intended to mean a vessel having a chamber (including a flow channel and depressions) where a reaction can be carried out, an inlet for delivering reagent(s) to the chamber, and an outlet for removing reagent(s) from the chamber. In some examples, the chamber enables the detection of the reaction that occurs in the chamber. For example, the chamber/flow channel can include one or more transparent surfaces allowing for the optical detection of arrays, optically labeled molecules, or the like, at the depression(s).

As used herein, a "flow channel" may be an area defined between two bonded or otherwise attached components, which can selectively receive a liquid sample. In some examples, the flow channel may be defined between a patterned resin and a lid or two patterned resins, and thus may be in fluid communication with one or more depressions defined in the patterned resin(s).

As used herein, "heteroaryl" refers to an aromatic ring or ring system (i.e., two or more fused rings that share two adjacent atoms) that contain(s) one or more heteroatoms, that is, an element other than carbon, including but not limited to, nitrogen (N), oxygen (O) and sulfur (S), in the ring backbone. When the heteroaryl is a ring system, every ring in the system is aromatic. The heteroaryl group may have 5-18 ring members.

As used herein, "heterocycle" means a non-aromatic cyclic ring or ring system containing at least one heteroatom in the ring backbone. Heterocycles may be joined together in a fused, bridged or spiro-connected fashion. Heterocycles may have any degree of saturation provided that at least one ring in the ring system is not aromatic. In the ring system, the heteroatom(s) may be present in either a non-aromatic or aromatic ring. The heterocycle group may have 3 to 20 ring members (i.e., the number of atoms making up the ring backbone, including carbon atoms and heteroatoms). In some examples, the heteroatom(s) are O, N, or S.

The term "hydrazine" or "hydrazinyl" as used herein refers to a —$NHNH_2$ group.

As used herein, the term "hydrazone" or "hydrazonyl" as used herein refers to a

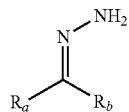

group in which $R_a$ and $R_b$ are each independently selected from hydrogen (e.g., 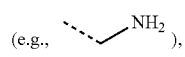 ), C1-C6 alkyl, C2-C6 alkenyl, C2-C6 alkynyl, C3-C7 carbocycle, C6-C10 aryl, 5-10 membered heteroaryl, and 5-10 membered heterocycle, as defined herein.

As used herein, "hydroxy" or "hydroxyl" refers to an —OH group.

As used herein, the term "interstitial region" refers to an area on a surface (e.g., of a cured patterned resin) that separates depressions. For example, an interstitial region can separate one feature of an array from another feature of the array. The two features that are separated from each other can be discrete, i.e., lacking physical contact with each other. In another example, an interstitial region can separate a first portion of a feature from a second portion of a feature. In many examples, the interstitial region is continuous whereas the features are discrete, for example, as is the case for a plurality of wells defined in an otherwise continuous surface. In other examples, the interstitial regions and the features are discrete, for example, as is the case for a plurality of trenches separated by respective interstitial regions. The separation provided by an interstitial region can be partial or full separation. Interstitial regions may have a surface material that differs from the surface material of the features defined in the surface. For example, features of an array can have an amount or concentration of a polymer coating and primer(s) that exceeds the amount or concentration present at the interstitial regions. In some examples, the polymer coating and primer(s) may not be present at the interstitial regions.

"Nitrile oxide," as used herein, means a "$R_aC{\equiv}N^+O^-$" group in which $R_a$ is defined herein. Examples of preparing nitrile oxide include in situ generation from aldoximes by treatment with chloramide-T or through action of base on imidoyl chlorides [RC(Cl)=NOH] or from the reaction between hydroxylamine and an aldehyde.

"Nitrone," as used herein, means a

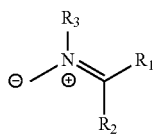

group in which $R_1$, $R_2$, and $R_3$ may be any of the $R_a$ and $R_b$ groups defined herein.

As used herein, a "nucleotide" includes a nitrogen containing heterocyclic base, a sugar, and one or more phosphate groups. Nucleotides are monomeric units of a nucleic acid sequence. In RNA, the sugar is a ribose, and in DNA, the sugar is a deoxyribose, i.e. a sugar lacking a hydroxyl group that is present at the 2' position in ribose. The nitrogen containing heterocyclic base (i.e., nucleobase) can be a purine base or a pyrimidine base. Purine bases include adenine (A) and guanine (G), and modified derivatives or analogs thereof. Pyrimidine bases include cytosine (C), thymine (T), and uracil (U), and modified derivatives or analogs thereof. The C-1 atom of deoxyribose is bonded to N-1 of a pyrimidine or N-9 of a purine. A nucleic acid analog may have any of the phosphate backbone, the sugar, or the nucleobase altered. Examples of nucleic acid analogs include, for example, universal bases or phosphate-sugar backbone analogs, such as peptide nucleic acid (PNA).

The term "average particle size," as used herein, refers to a volume-weighted mean diameter or a mass-weighted mean diameter of a particle distribution. "D10" means that 10% of the particles in the distribution are less than the given size, "D50" means that 50% of the particles in the distribution are less than the given size, and "D90" means that 90% of the particles in the distribution are less than the given size. In an example, the D50 particle size of the functionalized silica nanoparticles is up to 10 nm.

As used herein, a "photoacid generator" (PAG) is a molecule that becomes acidic upon exposure to radiation or to free radicals. PAGs generally undergo proton photodissociation irreversibly.

As used herein, a "photoinitiator" (PI) is a molecule that undergoes a photoreaction upon absorption of radiation, thereby producing reactive species. Photoinitiators are capable of initiating or catalyzing chemical reactions that result in changes in the solubility and/or physical properties of formulations.

As used herein, the "primer" is defined as a single stranded nucleic acid sequence (e.g., single strand DNA). Some primers, which may be referred to as amplification primers, serve as a starting point for template amplification and cluster generation. Other primers, which may be referred to as sequencing primers, serve as a starting point for DNA synthesis. The 5' terminus of the primer may be modified to allow a coupling reaction with a functional group of a polymer coating. The primer length can be any number of bases long and can include a variety of non-natural nucleotides. In an example, the sequencing primer is a short strand, ranging from 10 to 60 bases, or from 20 to 40 bases.

The term "resin composition" refers to the combination of the epoxy resin matrix and the functionalized silica nanoparticles. The resin composition may also include a photoinitiator, a photoacid generator, and a surface additive. The term "diluted resin composition" refers to the resin composition mixed with a liquid carrier. The liquid carrier may render the resin composition more readily depositable. The term "nanoimprintable resin composition" refers to the resin composition that has been deposited and from which at least some of the liquid carrier has evaporated.

A "spacer layer," as used herein refers to a material that bonds two components together. In some examples, the spacer layer can be a radiation-absorbing material that aids in bonding, or can be put into contact with a radiation-absorbing material that aids in bonding. The spacer layer may be present in a bonding region, e.g., an area on a substrate that is to be bonded to another material, which may be, as examples, a spacer layer, a lid, another substrate, etc., or combinations thereof (e.g., the spacer layer and a lid). The bond that is formed at the bonding region may be a chemical bond (as described above), or a mechanical bond (e.g., using a fastener, etc.).

A "thiol" functional group refers to —SH.

As used herein, the terms "tetrazine" and "tetrazinyl" refer to six-membered heteroaryl group comprising four nitrogen atoms. Tetrazine can be optionally substituted.

"Tetrazole," as used herein, refer to five-membered heterocyclic group including four nitrogen atoms. Tetrazole can be optionally substituted.

Resin Compositions

In the examples disclosed herein, the resin composition includes an epoxy resin matrix, and functionalized silica nanoparticles incorporated into the epoxy resin matrix, the functionalized silica nanoparticles having an average particle size up to about 10 nm.

The epoxy resin matrix includes at least one epoxy material. Any suitable epoxy monomer or cross-linkable epoxy copolymer may be used as the epoxy material. The epoxy material may be selected from the group consisting of:

i) an epoxy functionalized silsesquioxane (described further hereinbelow);

ii) trimethylolpropane triglycidyl ether:

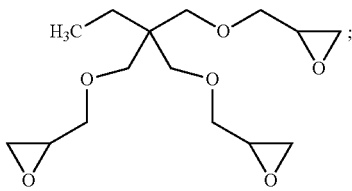 [SMILES: CCC(COCC1CO1)(COCC1CO1)COCC1CO1]

iii) tetrakis(epoxycyclohexyl ethyl)tetramethyl cyclotetrasiloxane:

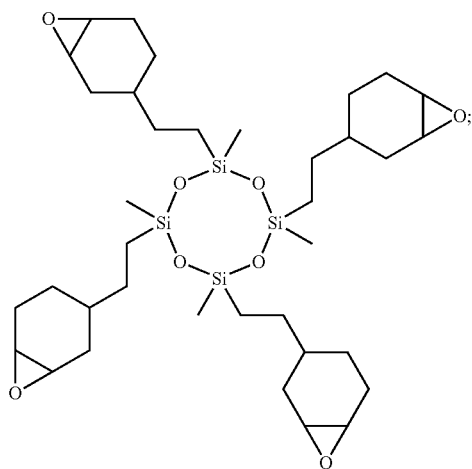 [SMILES: C[Si]1(CCC2CCC3OC3C2)O[Si](C)(CCC2CCC3OC3C2)O[Si](C)(CCC2CCC3OC3C2)O[Si](C)(CCC2CCC3OC3C2)O1]

iv) a copolymer of (epoxycyclohexylethyl)methylsiloxane and dimethylsiloxane:

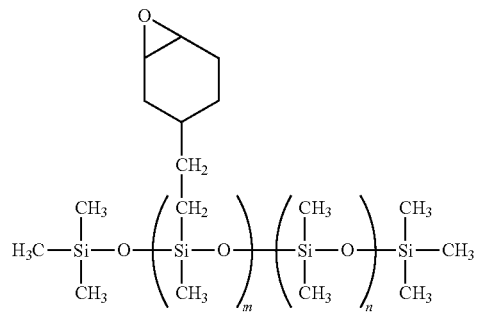

(wherein a ratio of m:n ranges from 8:92 to 10:90);

v) 1,3-bis[2-(3,4-epoxycyclohexyl) ethyl] tetramethyl disiloxane:

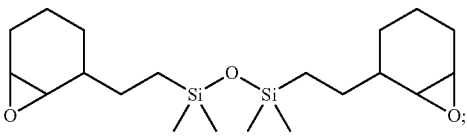 [SMILES: C[Si](C)(CCC1CCCC2OC12)O[Si](C)(C)CCC1CCCC2OC12]

vi) 1,3-bis(glycidoxypropyl)tetramethyl disiloxane:

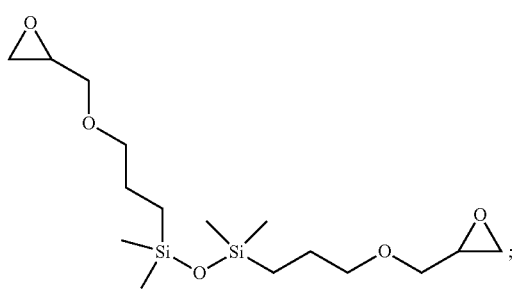 [SMILES: C[Si](C)(CCCOCC1CO1)O[Si](C)(C)CCCOCC1CO1]

vii) 3,4-epoxycyclohexylmethyl-3,4-epoxycyclo-hexanecarboxylate:

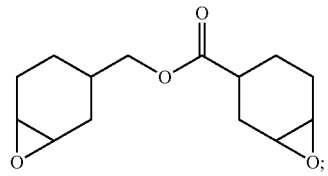 [SMILES: O=C(OCC1CCC2OC2C1)C1CCC2OC2C1]

viii) bis((3,4-epoxycyclohexyl)methyl) adipate:

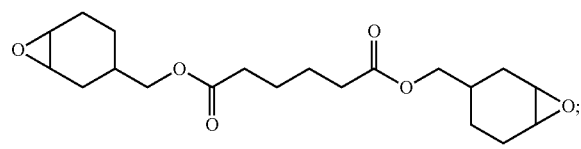 [SMILES: O=C(CCCCC(=O)OCC1CCC2OC2C1)OCC1CCC2OC2C1]

ix) 4-vinyl-1-cyclohexene 1,2-epoxide:

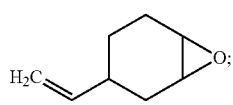

x) vinylcyclohexene dioxide:

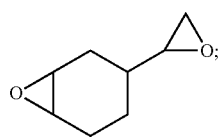

xi) 4,5-epoxytetrahydrophthalic acid diglycidylester:

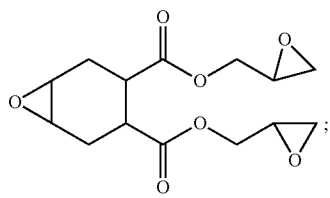 [SMILES: O=C(OCC1CO1)C1CC2OC2CC1C(=O)OCC1CO1]

xii) 1,2-epoxy-3-phenoxypropane:

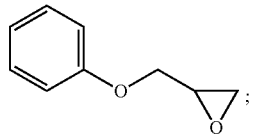 [SMILES: c1ccc(OCC2CO2)cc1]

xiii) glycidyl methacrylate:

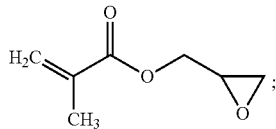

xiv) 1,2-epoxyhexadecane:

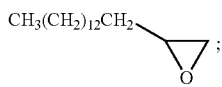

xv) poly(ethylene glycol) diglycidylether:

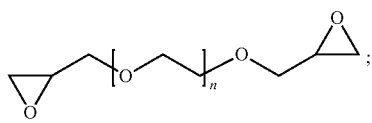

(wherein n ranges from 1 to 100);

xvi) pentaerythritol glycidyl ether:

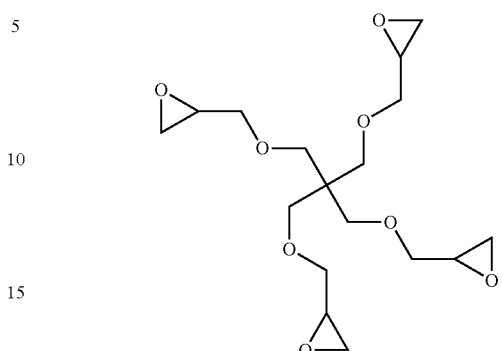

xvii) diglycidyl 1,2-cyclohexanedicarboxylate:

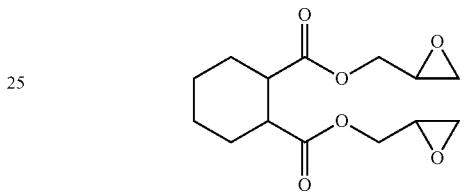

xviii) tetrahydrophthalic acid diglycidyl ester:

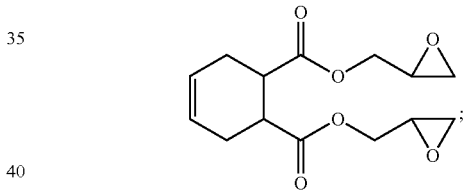

and xix) combinations thereof. When combinations are used, it is to be understood that any number of the listed epoxy resin materials may be used together in the resin composition. In an example, the resin composition does not include any other monomers or co-polymers.

The epoxy functionalized silsesquioxane includes a silsesquioxane core that is functionalized with epoxy groups.

As used herein, the term "silsesquioxane" refers to a chemical composition that is a hybrid intermediate ($RSiO_{1.5}$) between that of silica ($SiO_2$) and silicone ($R_2SiO$). An example silsesquioxane includes a polyhedral oligomeric silsesquioxane, (commercially available under the tradename POSS® from Hybrid Plastics Inc.). An example of polyhedral oligomeric silsesquioxane can be that described in Kehagias et al., Microelectronic Engineering 86 (2009), pp. 776-778, which is incorporated by reference in its entirety. The composition is an organosilicon compound with the chemical formula $[RSiO_{3/2}]_n$, where n is an even integer ranging from 6 to 14 and at least some of the R groups are epoxy groups. The resin composition disclosed herein may include one or more different cage or core silsesquioxane structures as monomeric units.

In some examples, all of the R groups of the polyhedral oligomeric silsesquioxane are epoxy groups. An example of this type of epoxy functionalized silsesquioxane is glycidyl polyhedral oligomeric silsesquioxane having the structure:

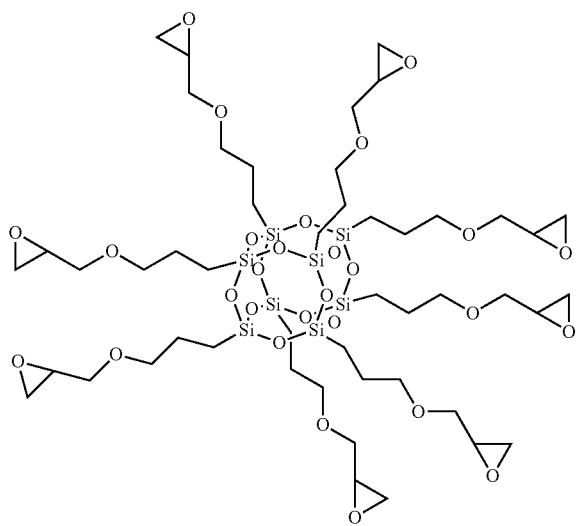

Another example of this type of epoxy functionalized silsesquioxane is epoxycyclohexyl ethyl functionalized polyhedral oligomeric silsesquioxane having the structure:

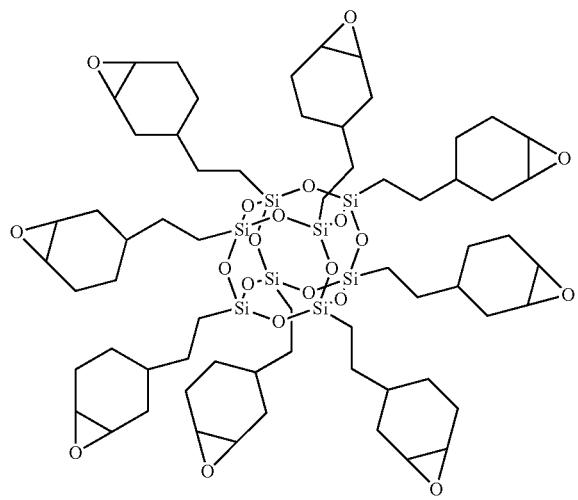

One example of the epoxy resin matrix disclosed herein includes the epoxy functionalized polyhedral oligomeric silsesquioxane, where the epoxy functionalized polyhedral oligomeric silsesquioxane is selected from the group consisting of a glycidyl functionalized polyhedral oligomeric silsesquioxane, an epoxycyclohexyl ethyl functionalized polyhedral oligomeric silsesquioxane, and combinations thereof. This example may include the epoxy silsesquioxane material(s) alone, or in combination with an additional epoxy material selected from the group consisting of trimethylolpropane triglycidyl ether; tetrakis(epoxycyclohexyl ethyl)tetramethyl cyclotetrasiloxane; a copolymer of (epoxycyclohexylethyl)methylsiloxane and dimethylsiloxane; 1,3-bis[2-(3,4-epoxycyclohexyl) ethyl] tetramethyl disiloxane; 1,3-bis(glycidoxypropyl)tetramethyl disiloxane; 3,4-epoxycyclohexylmethyl-3,4-epoxycyclo-hexanecarboxylate; bis((3,4-epoxycyclohexyl)methyl) adipate; 4-vinyl-1-cyclohexene 1,2-epoxide; vinylcyclohexene dioxide; 4,5-epoxytetrahydrophthalic acid diglycidylester; 1,2-epoxy-3-phenoxypropane; glycidyl methacrylate; 1,2-epoxyhexadecane; poly(ethylene glycol) diglycidylether; pentaerythritol glycidyl ether; diglycidyl 1,2-cyclohexanedicarboxylate; tetrahydrophthalic acid diglycidyl ester; and combinations thereof.

In other silsesquioxane examples, a majority of the R groups are epoxy groups. For example, 6 of the 8 R groups are epoxy groups and 2 of the 8 R groups are non-epoxy functional groups, which may be selected from the group consisting of an azide/azido, a thiol, a poly(ethylene glycol), a norbornene, and a tetrazine, or further, for example, alkyl, aryl, alkoxy, and haloalkyl groups. In some aspects, the non-epoxy functional group is selected to increase the surface energy of the resin. In these other examples, the ratio of epoxy groups to non-epoxy groups ranges, for example, from 7:1 to 5:3, or 9:1 to 6:4, or 11:1 to 7:5.

Whether a single epoxy material or a combination of epoxy materials is used in the epoxy resin matrix, the total amount of the epoxy resin matrix (epoxy resin material(s)) ranges from about 57 mass % to less than 100 mass %, based on the total solids in the resin composition. In another example, the epoxy resin matrix (epoxy resin material(s)) makes up from about 65 mass % to less than 100 mass % (e.g., about 97.5 mass %) of the total solids in the resin composition.

With any of the example epoxy materials disclosed herein, it is to be understood that the epoxy group(s) allow the monomeric units and/or the copolymer to polymerize and/or cross-link into a cross-linked matrix upon initiation using ultraviolet (UV) light and acid(s) (generated by a photoacid generator, which is described below).

In the examples of the resin composition disclosed herein, functionalized silica nanoparticles are included. The surface functional groups of the functionalized silica nanoparticles, the particle size of the functionalized silica nanoparticles, and the amount of the functionalized silica nanoparticles contribute to the imprintability of the resin composition, the curing efficiency of the resin composition, and the improved mechanical properties of the cured resin composition.

The functionalized silica nanoparticles include a silicon dioxide ($SiO_2$) core and functional groups attached at the surface of the $SiO_2$ core. The presence of the surface functional groups contributes to the imprintability of the resin composition, as comparative compositions with non-functionalized silicon dioxide particles are not imprintable (see example section). In an example, the surface functional groups are acrylic functional groups. Examples of suitable acrylic functional groups include acrylic acid, methacrylic acid, substituted and unsubstituted acrylates, acrylamides, etc. In other examples, the surface functional groups may be carboxy functional groups and/or amino functional groups. Any combination of the acrylic functional groups, carboxy functional groups, and amino functional groups may also be used.

The functionalized silica nanoparticles have an average particle size up to about 10 nm. In an example, the average particle size of the functionalized silica nanoparticles ranges from about 0.1 nm to about 10 nm. In other examples, the average particle size of the functionalized silica nanoparticles ranges from about 1 nm to about 10 nm, e.g., from about 1 nm to about 5 nm, from about 2 nm to about 8 nm, from about 6 nm to about 9 nm, etc. The small particle size of the functionalized silica nanoparticles contributes to the imprintability of the resin composition, as comparative compositions with larger functionalized silicon dioxide particles are not imprintable (see example section).

The functionalized silica nanoparticles are present in the resin composition in an amount ranging from greater than 0 mass % up to about 35 mass % of the total solids in the resin composition. In other examples, the functionalized silica nanoparticles are present in the resin composition in an amount ranging from 5 mass % up to about 30 mass % of the total solids in the resin composition, e.g., from about 7 mass % to about 25 mass % of the total solids, from about 12 mass % to about 25 mass % of the total solids, from about 12 mass % to about 21 mass % of the total solids, etc. The amount of the functionalized silica nanoparticles contributes to a suitable viscosity for deposition, and also contributes to the imprintability of the resin composition. The amount of the functionalized silica nanoparticles also contributes to the curability of the resin composition, as comparative compositions with higher amounts of functionalized silicon dioxide particles have higher FTIR values (see example section), suggesting that the higher loadings impede the polymerization process. The amount of the functionalized silica nanoparticles also improves the mechanical properties of the cured resin composition.

Because the epoxy resin matrix may include one or more cationically curable species, the resin composition also includes an initiating system, such as a direct photoacid generator or a combination of a photoinitiator and a photoacid generator to initiate curing of the epoxy resin matrix material(s).

The direct photoacid generator does not require a photoinitiator to initiate its decomposition, and thus can directly generate an acid, which, in turn, initiates the polymerization and/or crosslinking of the epoxy resin matrix component(s). Suitable examples of the direct photoacid generator may be selected from the group consisting of:

i) diaryliodonium hexafluorophosphate:

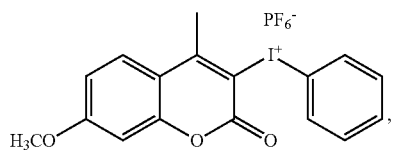

ii) diaryliodonium hexafluoroantimonate:

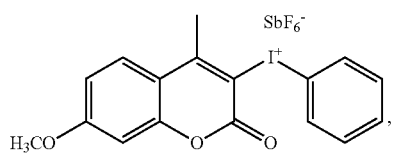

iii) (cumene)cyclopentadienyliron (II) hexafluorophosphate:

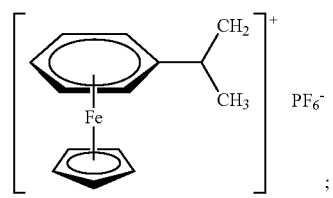

and iv) combinations thereof. When combinations are used, it is to be understood that any two or more of the listed direct photoacid generators may be used together in the examples of the resin composition as long they both are soluble in the solvent used in the resin composition.

In an example, a mass ratio of the epoxy resin matrix to the direct photoacid generator ranges from about 99.8:0.2 to 90:10. In another example, a mass ratio of the epoxy resin matrix to the direct photoacid generator ranges from about 98:2 to 95:5. In still another example, a mass ratio of the epoxy resin matrix to the direct photoacid generator ranges from about 96:4 to 99:1. When lower amounts of the direct photoacid generator are included, the UV cure time may have to be increased to allow for complete reaction.

In other examples, the resin composition includes the photoinitiator and the photoacid generator. The free radicals generated by the photoinitiator react with the photoacid generator, which decomposes to generate the acid, which, in turn, initiates the polymerization and/or crosslinking of the epoxy resin matrix component(s).

The free radical photoinitiator may be selected from the group consisting of 2-ethyl-9,10-dimethoxyanthracene, 2,2-dimethoxy-2-phenylacetophenone, 2-ethoxy-2-phenylacetophenone, and a phosphine oxide.

In some examples, the free radical photoinitiator is 2-ethyl-9,10-dimethoxyanthracene:

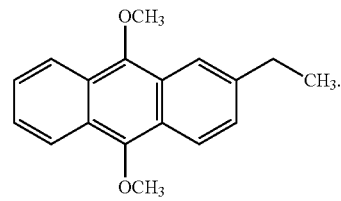 [SMILES: CCc1ccc2c(OC)c3ccccc3c(OC)c2c1]

In other examples, the free radical photoinitiator 2,2-dimethoxy-2-phenylacetophenone:

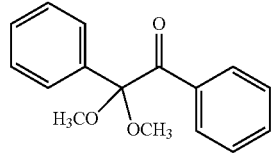 [SMILES: COC(OC)(C(=O)c1ccccc1)c1ccccc1]

In yet other examples, the free radical photoinitiator is 2-ethoxy-2-phenylacetophenone (a.k.a., benzoin ethyl ether):

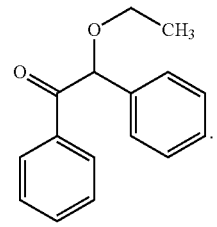 [SMILES: CCOC(C(=O)c1ccccc1)c1ccccc1]

In still other examples, the free radical photoinitiator is the phosphine oxide. When the phosphine oxide is used, it may be selected from the group consisting of:

i) diphenyl(2,4,6-trimethylbenzoyl)phosphine oxide:

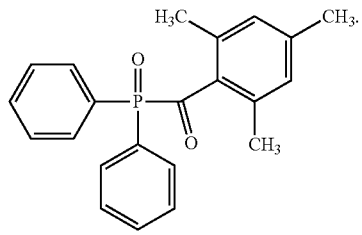 [SMILES: Cc1cc(C)c(C(=O)P(=O)(c2ccccc2)c2ccccc2)c(C)c1]

ii) a blend of diphenyl(2,4,6-trimethylbenzoyl)phosphine oxide and 2-hydroxy-2-methylpropiophenone:

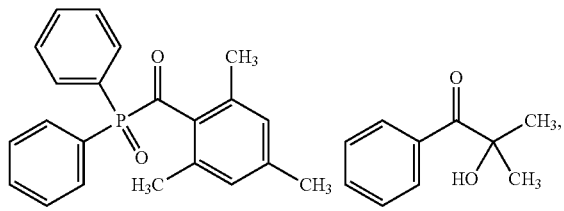

iii) phenylbis(2,4,6-,trimethylbenzoyl)phosphine oxide:

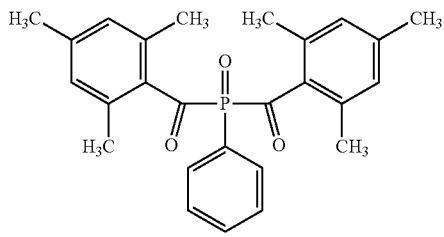

iv) ethyl(2,4,6-trimethylbenzoyl)phenylphosphinate:

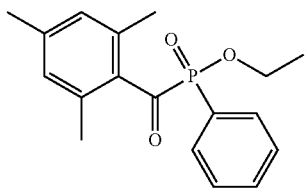 [SMILES: CCOP(=O)(C(=O)c1c(C)cc(C)cc1C)c1ccccc1]

v) combinations thereof. When combinations are used, it is to be understood that any two or more of the listed free radical photoinitiators may be used together in this example of the resin composition.

In addition to the free radical photoinitiator, these examples of the resin composition also include the photoacid generator (PAG), which is not a direct photoacid generator. It is believed that any suitable photoacid generator that will not undergo undesirable intramolecular interactions with the free radical photoinitiator may be used. Examples of suitable photoacid generators may include benzyl, imino ester, conjugated imino ester, spiropyran, teraylene-based, two-photon, and organometallic PAG systems.

Some specific examples of suitable photoacid generators for use in combination with the photoinitiator are selected from the group consisting of:

i) N-hydroxynaphthalimide triflate:

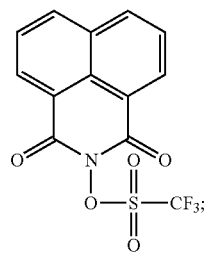 [SMILES: O=C1c2cccc3cccc(c23)C(=O)N1OS(=O)(=O)C(F)(F)F]

ii) triarylsulfonium hexafluorophosphate salts, mixed:

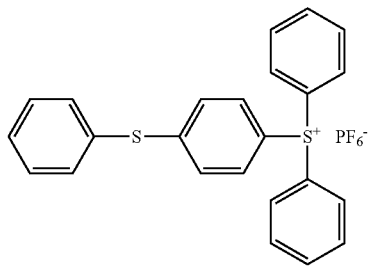

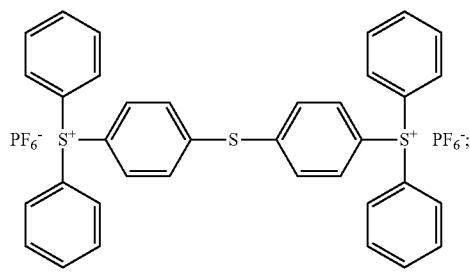

iii) triarylsulfonium hexafluoroantimonate salts, mixed:

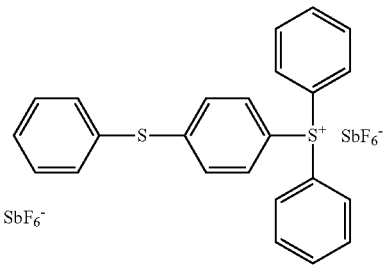

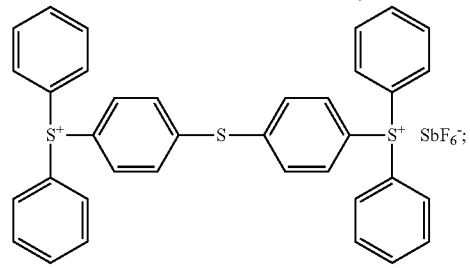

iv) 1-naphthyl diphenylsulfonium triflate (NDS-TF):

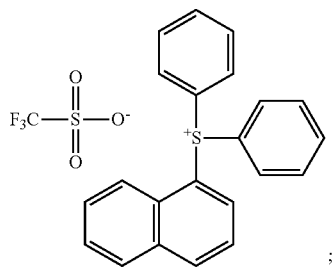 [SMILES: O=S(=O)([O-])C(F)(F)F ; c1ccc([S+](c2ccccc2)c2cccc3ccccc23)cc1]

v) (4-phenylthiophenyl)diphenylsulfonium triflate:

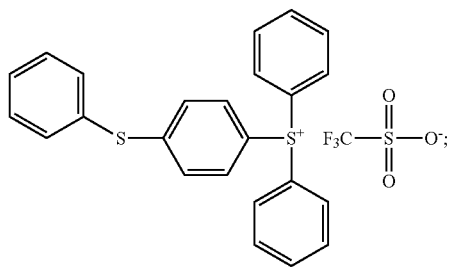

vi) bis-(4-methylphenyl)iodonium hexafluorophosphate:

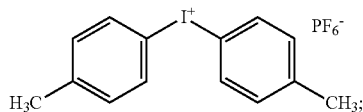

vii) bis(4-tert-butylphenyl)iodonium hexafluorophosphate:

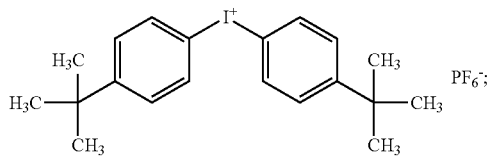

viii) (2-methylphenyl)(2,4,6-trimethylphenyl)iodonium triflate:

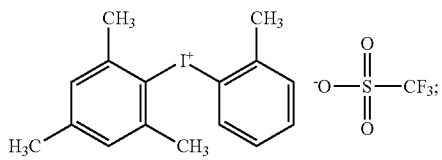

ix) bis(2,4,6-trimethylphenyl)iodonium triflate:

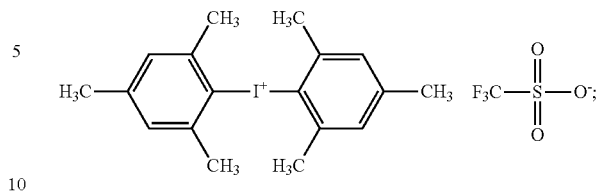

x) bis-(4-dedecylphenyl)iodonium hexafluoroantimonate salt:

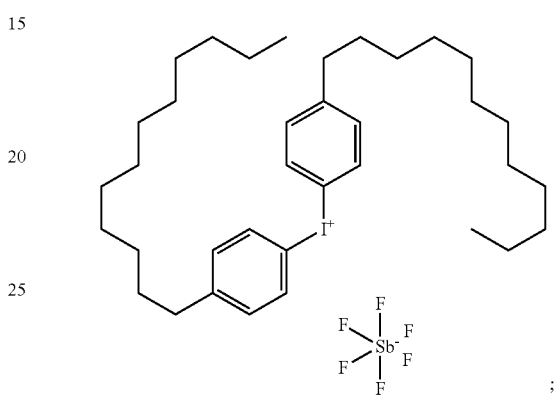

and xi) combinations thereof. Combinations of the photoacid generators may be used as long as they are soluble in the selected solvent.

In these examples, a mass ratio of the epoxy resin matrix to the free radical photoinitiator/photoacid generator combination ranges from about 99.8:0.2 to 90:10. In another example, a mass ratio of the epoxy resin matrix to the free radical photoinitiator/photoacid generator combination ranges from about 98:2 to 95:5. In still another example, a mass ratio of the epoxy resin matrix to the free radical photoinitiator/photoacid generator combination ranges from about 96:4 to 99:1. When lower amounts of the free radical photoinitiator/photoacid generator combination are included, the UV cure time may have to be increased to allow for complete reaction.

Some examples of the resin composition may also include a surface additive. The surface additive can adjust the surface tension of the resin composition, which can improve the detachability of the resin from an imprinting apparatus (e.g., a working stamp), improve the coatability of the diluted resin composition, promote thin film stability, and/or improve leveling. Examples of surface additives include polyacrylate polymers (such as BYK®-350 available from BYK). The amount of the surface additive may be 3 mass % or less, based on the total mass of the resin composition.

The resin composition may also include a liquid carrier. The resin composition including the liquid carrier may be referred to herein as the diluted resin composition. The liquid carrier may be added to achieve a desired viscosity for the deposition technique being used to apply the resin composition. Examples of the diluted resin composition viscosity (e.g., after the liquid carrier is introduced) ranges from about 1.75 mPa to about 2.2 mPa (measured at 25° C.). Examples of suitable liquid carriers include propylene glycol monomethyl ether acetate (PGMEA), toluene, dimethyl sulfoxide (DMSO), tetrahydrofuran (THF), etc. In some examples, the liquid carrier is PGMEA. The total solids concentration of the diluted resin composition may range from about 15 mass % to about 60 mass %, and the amount of liquid carrier may range from about 40 mass % to about 85 mass %. Not to be bound by any particular theory, but it is believed that the upper limits may be higher depending upon the respective solubility of the solid component(s) in the liquid carrier that is selected.

One example of the diluted resin composition includes the liquid carrier and solids dispersed in the liquid carrier, the solids consisting of an epoxy material selected from the group consisting of an epoxy functionalized silsesquioxane; trimethylolpropane triglycidyl ether; tetrakis(epoxycyclohexyl ethyl)tetramethyl cyclotetrasiloxane; a copolymer of (epoxycyclohexylethyl)methylsiloxane and dimethylsiloxane; 1,3-bis[2-(3,4-epoxycyclohexyl) ethyl] tetramethyl disiloxane; 1,3-bis(glycidoxypropyl)tetramethyl disiloxane; 3,4-epoxycyclohexylmethyl-3,4-epoxycyclo-hexanecarboxylate; bis((3,4-epoxycyclohexyl)methyl) adipate; 4-vinyl-1-cyclohexene 1,2-epoxide; vinylcyclohexene dioxide; 4,5-epoxytetrahydrophthalic acid diglycidylester; 1,2-epoxy-3-phenoxypropane; glycidyl methacrylate; 1,2-epoxyhexadecane; poly(ethylene glycol) diglycidylether; pentaerythritol glycidyl ether; diglycidyl 1,2-cyclohexanedicarboxylate; tetrahydrophthalic acid diglycidyl ester; and combinations thereof; functionalized silica nanoparticles; an initiating system selected from the group consisting of a direct photoacid generator and a combination of a photoinitiator and a photoacid generator; and an optional surface additive.

An example of the method for making the diluted resin composition is shown in FIG. 1. The method 100 includes mixing an epoxy resin matrix and a liquid carrier to form a dispersion (reference numeral 102); and incorporating functionalized silica nanoparticles having an average particle size up to about 10 nm into the dispersion, thereby forming a diluted resin composition (reference numeral 104). The functionalized silica nanoparticles may also be suspended in the same type of liquid carrier before they are added to the dispersion.

The method 100 may also include adding the direct photoacid generator or the combination of the photoinitiator and the photoacid generator to the diluted resin composition. Some examples of the method 100 may also include adding the surface additive to the diluted resin composition.

In the method 100, any examples of the epoxy resin matrix, the functionalized silica nanoparticles, the direct photoacid generator or the combination of the photoinitiator and the photoacid generator, the surface additive, and the liquid carrier may be used in any of the amounts set forth herein.

Flow Cell and Method

Figure 2:
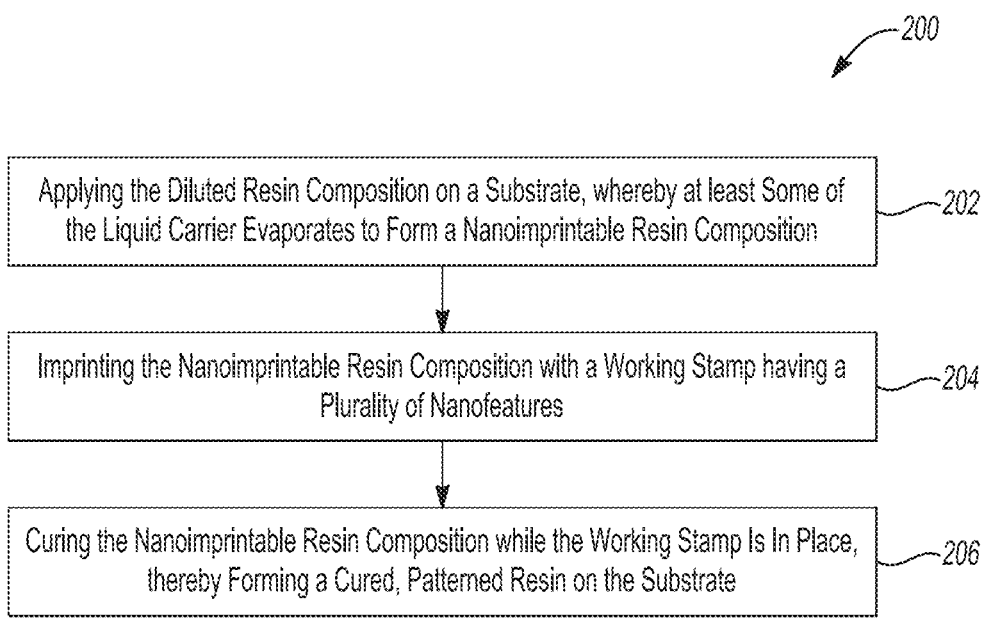
FIG. 2 is a flow diagram illustrating an example of a method for using an example of the diluted resin composition disclosed herein.

Any example of the resin composition disclosed herein may be used in the formation of a flow cell. An example of a method 200 for patterning the resin composition to form an interior surface of the flow cell is shown in FIG. 2. As shown, one example of the method 100 includes applying the diluted resin composition on a substrate, whereby at least some of the liquid carrier evaporates to form a nanoimprintable resin composition (reference numeral 202); imprinting the nanoimprintable resin composition with a working stamp having a plurality of nanofeatures (reference numeral 204); and curing the nanoimprintable resin composition while the working stamp is in place, thereby forming a cured, patterned resin on the substrate (reference numeral 206).

The resulting flow cell surface includes a substrate and a cured, patterned resin on the substrate, the cured, patterned resin including depressions separated by interstitial regions, and the cured, patterned resin including a cured form of an example of the resin composition disclosed herein.

The method 200 is shown schematically in FIG. 3A through FIG. 3E. Some examples of the method 200 further include functionalizing the depressions for a particular application, such as sequencing. An example of the functionalization of the depressions is shown in FIG. 3D and FIG. 3E. A cross-section of the flow cell surface formed using the method 200 is shown in FIG. 3F.

FIG. 3A depicts a substrate 12, and FIG. 3B depicts an example of the resin composition 10 deposited on the substrate 12. Throughout the discussion of the method 200, the phrase "resin composition 10" may, in some instances, refer to the diluted resin composition, and may, in other instances, refer to the nanoimprintable resin composition.

Examples of suitable substrates 12 include epoxy siloxane, glass, modified or functionalized glass, plastics (including acrylics, polystyrene and copolymers of styrene and other materials, polypropylene, polyethylene, polybutylene, polyurethanes, polytetrafluoroethylene (such as TEFLON® from Chemours), cyclic olefins/cyclo-olefin polymers (COP) (such as ZEONOR® from Zeon), polyimides, etc.), nylon (polyamides), ceramics/ceramic oxides, silica, fused silica, or silica-based materials, aluminum silicate, silicon and modified silicon (e.g., boron doped p+ silicon), silicon nitride ($Si_3N_4$), silicon oxide ($SiO_2$), tantalum pentoxide ($Ta_2O_5$) or other tantalum oxide(s) ($TaO_x$), hafnium oxide ($HfO_2$), carbon, metals, inorganic glasses, or the like. The substrate 12 may also be glass or silicon, with a coating layer of tantalum oxide or another ceramic oxide at the surface.

Some examples of the substrate 12 may have a surface-bound epoxy silane attached thereto, which can interact with the other resin composition components to form the cured resin composition 10' on the substrate 12.

In an example, the substrate 12 may have a diameter ranging from about 2 mm to about 300 mm, or a rectangular sheet or panel having its largest dimension up to about 10 feet (~3 meters). In an example, the substrate 12 is a wafer having a diameter ranging from about 200 mm to about 300 mm. In another example, the substrate 12 is a die having a width ranging from about 0.1 mm to about 10 mm. While example dimensions have been provided, it is to be understood that a substrate 12 with any suitable dimensions may be used. For another example, a panel may be used that is a rectangular substrate 12, which has a greater surface area than a 300 mm round wafer.

The resin composition 10 may be any examples of the resin composition described herein, which includes the epoxy resin matrix and the functionalized silica nanoparticles. The diluted resin composition 10 has a viscosity that is suitable for application via a desired technique, and thus is applied on the substrate 12. The diluted resin composition 10 may be applied on the substrate 12 using any suitable application technique, which may be manual or automated. As examples, the application of the diluted resin composition 10 may be performed using vapor deposition techniques, coating techniques, grafting techniques, or the like. Some specific examples include chemical vapor deposition (CVD), spray coating (e.g., ultrasonic spray coating), spin coating, dunk or dip coating, doctor blade coating, puddle dispensing, aerosol printing, screen printing, microcontact printing, inkjet printing, or the like. In one example, spin coating is used.

The technique used to apply the diluted resin composition 10 may cause at least some of the liquid carrier to evaporate. After the diluted resin composition 10 is applied to the substrate surface, it may be softbaked to remove excess liquid carrier. The resulting film has a desirable thickness and is nanoimprintable. This film is referred to as the nanoimprintable resin composition.

When performed, the softbake may take place after the diluted resin composition 10 is deposited and before the working stamp 14 is positioned therein. The softbake may take place at a lower temperature than is used for curing (e.g., ranging from about 50° C. to about 150° C.) and for a time ranging from greater than 0 seconds to about 3 minutes. In an example, the softbake time ranges from about 30 seconds to about 2.5 minutes.

The nanoimprintable resin composition 10 is then patterned, using any suitable patterning technique. In the example shown in FIG. 3B, nanoimprint lithography is used to pattern the resin composition 10. As illustrated in FIG. 3B, a nanoimprint lithography mold or working stamp 14 is pressed against the layer of the nanoimprintable resin composition 10 to create an imprint in the nanoimprintable resin composition 10. In other words, the nanoimprintable resin composition 10 is indented or perforated by the protrusions (nanofeatures 16) of the working stamp 14. The nanoimprintable resin composition 10 may be then be cured with the working stamp 14 in place.

For the resin compositions 10 disclosed herein, curing may be accomplished by exposing the applied and nanoimprinted resin composition 10 to the incident light at an energy dose ranging from about 0.5 J to about 10 J for 30 seconds or less. The incident light may be actinic radiation, such as ultraviolet (UV) radiation. In one example, the majority of the UV radiation emitted may have a wavelength of about 365 nm.

In some examples disclosed herein, the energy exposure promotes decomposition of the direct photoacid generator into an acid that initiates polymerization and/or cross-linking of the epoxy resin matrix. In some instances, the incident light exposure time may be 30 seconds or less. In other instances, the incident light exposure time may be 20 seconds or less. In still other instances, the incident light exposure time may be about 5 seconds.

In other examples disclosed herein, the energy exposure causes the photoinitiator to generate free radicals, which promote decomposition of the photoacid generator into an acid that initiates polymerization and/or cross-linking of the epoxy resin matrix. With the effective extent of curing brought on by this mechanism, the incident light exposure time may be 30 seconds or less. In some instances, the incident light exposure time may be 20 seconds or less. In still other instances, the incident light exposure time may be about 5 seconds.

The curing process may include a single UV exposure stage. After curing and the release of the working stamp 14, topographic features are defined in the cured resin composition. As shown in FIG. 3C, the cured resin composition having the depressions 18 defined therein is referred to as the cured, patterned resin 10'. Due, at least in part, to the efficient photopolymerization, the method 200 disclosed herein may not involve a post UV curing hardbake step in order to attain well-cured films.

The cured, patterned resin 10' includes the functionalized silica nanoparticles distributed throughout the cured epoxy matrix. The exact chemical make-up of the cured, patterned resin 10' depends upon the epoxy resin matrix, the functionalized silica nanoparticles, the initiating system (e.g., the direct photoacid generator or the combination of the photoinitiator and the photoacid generator) used in the resin composition 10.

As shown in FIG. 3C, the cured, patterned resin 10' includes the depressions 18 defined therein, and interstitial regions 20 separating adjacent depressions 18. In the examples disclosed herein, the depressions 18 become functionalized with a polymeric hydrogel 22 (FIG. 3C and FIG. 3D) and primers 24, 26 (FIG. 3E and FIG. 3F), while portions of the interstitial regions 20 may be used for bonding but will not have the polymeric hydrogel 22 or the primer(s) 24, 26 thereon.

Many different layouts of the depressions 18 may be envisaged, including regular, repeating, and non-regular patterns. In an example, the depressions 18 are disposed in a hexagonal grid for close packing and improved density. Other layouts may include, for example, rectilinear (i.e., rectangular) layouts (e.g., lines or trenches), triangular layouts, and so forth. In some examples, the layout or pattern can be an x-y format of depressions 18 that are in rows and columns. In some other examples, the layout or pattern can be a repeating arrangement of depressions 18 and/or interstitial regions 20. In still other examples, the layout or pattern can be a random arrangement of depressions 18 and/or interstitial regions 20. The pattern may include stripes/lines, swirls, triangles, rectangles, circles, arcs, diagonals, arrows, squares, and/or cross-hatches. In an example, the depressions 18 are wells positioned in rows and columns, as shown in FIG. 3C.

The layout or pattern of the depressions 18 may be characterized with respect to the density of the depressions 18 (i.e., number of depressions 18) in a defined area. For example, the depressions 18 may be present at a density of approximately 2 million per $mm^2$. The density may be tuned to different densities including, for example, a density of at least about 100 per $mm^2$, about 1,000 per $mm^2$, about 0.1 million per $mm^2$, about 1 million per $mm^2$, about 2 million per $mm^2$, about 5 million per $mm^2$, about 10 million per $mm^2$, about 50 million per $mm^2$, or more, or less. It is to be further understood that the density of depressions 18 in the cured, patterned resin 10' can be between one of the lower values and one of the upper values selected from the ranges above. As examples, a high density array may be characterized as having depressions 18 separated by less than about 100 nm, a medium density array may be characterized as having depressions 18 separated by about 400 nm to about 1 μm, and a low density array may be characterized as having depressions 18 separated by greater than about 1 μm. While example densities have been provided, it is to be understood that substrates with any suitable densities may be used.

The layout or pattern of the depressions 18 may also or alternatively be characterized in terms of the average pitch, i.e., the spacing from the center of the depression 18 to the center of a directly adjacent depression 18 (center-to-center spacing) or from the right edge of one depression 18 to the left edge of a directly adjacent depression 18 (edge-to-edge spacing). The pattern can be regular, such that the coefficient of variation around the average pitch is small, or the pattern can be non-regular in which case the coefficient of variation can be relatively large. In either case, the average pitch can be, for example, at least about 10 nm, about 50 nm, about 0.1 μm, about 0.5 μm, about 1 μm, about 5 μm, about 10 μm, about 100 μm, or more, or less. The average pitch for a particular pattern of depressions 18 can be between one of the lower values and one of the upper values selected from the ranges above. In an example, the depressions 18 have a pitch (center-to-center spacing) of about 1.5 µm. While example average pitch values have been provided, it is to be understood that other average pitch values may be used.

The size of each depression 18 may be characterized by its volume, opening area, depth, and/or diameter.

Each depression 18 can have any volume that is capable of confining a fluid. The minimum or maximum volume can be selected, for example, to accommodate the throughput (e.g., multiplexity), resolution, nucleotides, or analyte reactivity expected for downstream uses of the flow cell. For example, the volume can be at least about $1\times10^{-3}$ µm$^3$, about $1\times10^{-2}$ µm$^3$, about 0.1 µm$^3$, about 1 µm$^3$, about 10 µm$^3$, about 100 µm$^3$, or more, or less. It is to be understood that the polymeric hydrogel 22 can fill all or part of the volume of a depression 18.

The area occupied by each depression opening can be selected based upon similar criteria as those set forth above for well volume. For example, the area for each depression opening can be at least about $1\times10^{-3}$ µm$^2$, about $1\times10^{-2}$ µm$^2$, about 0.1 µm$^2$, about 1 µm$^2$, about 10 µm$^2$, about 100 µm$^2$, or more, or less. The area occupied by each depression opening can be greater than, less than or between the values specified above.

The depth of each depression 18 can be large enough to house some of the polymeric hydrogel 22. In an example, the depth may be about 0.1 µm, about 0.5 µm, about 1 µm, about 10 µm, about 100 µm, or more, or less. In some examples, the depth is about 0.4 µm. The depth of each depression 18 can be greater than, less than or between the values specified above.

In some instances, the diameter or length and width of each depression 18 can be about 50 nm, about 0.1 µm, about 0.5 µm, about 1 µm, about 10 µm, about 100 µm, or more, or less. The diameter or length and width of each depression 18 can be greater than, less than or between the values specified above.

After the resin composition 10 is patterned and cured, the cured, patterned resin 10' may be treated to prepare the surface for application of a polymeric hydrogel 22.

In an example, the cured, patterned resin 10' may be exposed to silanization, which attaches a silane or the silane derivative to the cured, patterned resin 10'. Silanization introduces the silane or the silane derivative across the surface, including in the depressions 18 (e.g., on the bottom surface and along the side walls) and on the interstitial regions 20.

Silanization may be accomplished using any silane or silane derivative. The selection of the silane or silane derivative may depend, in part, upon the material that is to be used to form the polymeric hydrogel 22 (shown in FIG. 3D), as it may be desirable to form a covalent bond between the silane or silane derivative and the polymer hydrogel 22. The method used to attach the silane or silane derivative to the cured, patterned resin 10' may vary depending upon the silane or silane derivative that is being used. Several examples are set forth herein.

Examples of suitable silanization methods include vapor deposition (e.g., a YES method), spin coating, or other deposition methods. Some examples of methods and materials that may be used to silanized the cured, patterned resin 10' are described herein, although it is to be understood that other methods and materials may be used.

In an example utilizing the YES CVD oven, the cured, patterned resin 10' on the substrate 12 is placed in the CVD oven. The chamber may be vented and then the silanization cycle started. During cycling, the silane or silane derivative vessel may be maintained at a suitable temperature (e.g., about 120° C. for norbornene silane), the silane or silane derivative vapor lines be maintained at a suitable temperature (e.g., about 125° C. for norbornene silane), and the vacuum lines be maintained at a suitable temperature (e.g., about 145° C.).

In another example, the silane or silane derivative (e.g., liquid norbornene silane) may be deposited inside a glass vial and placed inside a glass vacuum desiccator with the substrate 12 having the cured, patterned resin 10' thereon. The desiccator can then be evacuated to a pressure ranging from about 15 mTorr to about 30 mTorr, and placed inside an oven at a temperature ranging from about 60° C. to about 125° C. Silanization is allowed to proceed, and then the desiccator is removed from the oven, cooled and vented in air.

Vapor deposition, the YES method and/or the vacuum desiccator may be used with a variety of silane or silane derivatives, such as those silane or silane derivative including a cycloalkene unsaturated moiety, such as norbornene, a norbornene derivative (e.g., a (hetero)norbornene including an oxygen or nitrogen in place of one of the carbon atoms), transcyclooctene, transcyclooctene derivatives, transcyclopentene, transcycloheptene, trans-cyclononene, bicyclo[3.3.1]non-1-ene, bicyclo[4.3.1]dec-1 (9)-ene, bicyclo[4.2.1]non-1(8)-ene, and bicyclo[4.2.1]non-1-ene. Any of these cycloalkenes can be substituted, for example, with an R group, such as hydrogen, alkyl, alkenyl, alkynyl, cycloalkyl, cycloalkenyl, cycloalkynyl, aryl, heteroaryl, heteroalicycle, aralkyl, or (heteroalicyclel)alkyl. An example of the norbornene derivative includes [(5-bicyclo[2.2.1]hept-2-enyl)ethyl]trimethoxysilane. As other examples, these methods may be used when the silane or silane derivative includes a cycloalkyne unsaturated moiety, such as cyclooctyne, a cyclooctyne derivative, or bicyclononynes (e.g., bicyclo[6.1.0]non-4-yne or derivatives thereof, bicyclo[6.1.0]non-2-yne, or bicyclo[6.1.0]non-3-yne). These cycloalkynes can be substituted with any of the R groups described herein.

The attachment of the silane or silane derivative forms a pre-treated (e.g., silanized) cured, patterned resin 10', which includes silanized depressions and silanized interstitial regions.

In other examples, the cured, patterned resin 10' may not be exposed to silanization. Rather, the cured, patterned resin 10' may be exposed to plasma ashing, and then the polymeric hydrogel 20 may be directly spin coated (or otherwise deposited) on the plasma ashed cured, patterned resin 10'. In this example, plasma ashing may generate surface-activating agent(s) (e.g., hydroxyl (C—OH or Si—OH) and/or carboxyl groups) that can adhere the polymeric hydrogel 22 to the cured, patterned resin 10'. In these examples, the polymeric hydrogel 22 is selected so that it reacts with the surface groups generated by plasma ashing.

In still other examples, the cured, patterned resin 10' may include unreacted epoxy groups; and thus may not be exposed to silanization because the unreacted epoxy groups can react directly with amino functional groups of the polymeric hydrogel 22. In this example, plasma ashing may be performed, e.g., if it is desirable to clean the surface of potential contaminants.

The polymeric hydrogel 22 may then be applied to the cured, patterned resin 10'. The polymeric hydrogel 22 may be a semi-rigid polymeric material that is permeable to liquids and gases and that is attached to the cured, patterned resin 10'.

An example of the polymeric hydrogel 22 includes an acrylamide copolymer, such as poly(N-(5-azidoacetamidylpentyl)acrylamide-co-acrylamide, PAZAM. PAZAM and some other forms of the acrylamide copolymer are represented by the following structure (I):

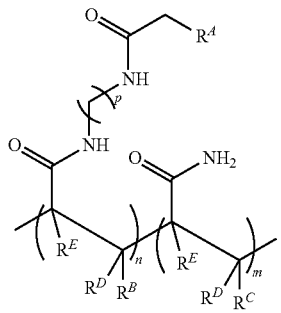

wherein:

$R^A$ is selected from the group consisting of azido, optionally substituted amino, optionally substituted alkenyl, optionally substituted alkyne, halogen, optionally substituted hydrazone, optionally substituted hydrazine, carboxyl, hydroxy, optionally substituted tetrazole, optionally substituted tetrazine, nitrile oxide, nitrone, sulfate, and thiol;

$R^B$ is H or optionally substituted alkyl;

$R^C$, $R^D$, and $R^E$ are each independently selected from the group consisting of H and optionally substituted alkyl;

each of the —$(CH_2)_p$— can be optionally substituted;

p is an integer in the range of 1 to 50;

n is an integer in the range of 1 to 50,000; and m is an integer in the range of 1 to 100,000.

It is noted that the arrangement of the recurring "n" and "m" features in structure (I) are representative, and the monomeric subunits may be present in any order in the polymer structure (e.g., random, block, patterned, or a combination thereof).

The molecular weight of PAZAM and other forms of the acrylamide copolymer may range from about 5 kDa to about 1500 kDa or from about 10 kDa to about 1000 kDa, or may be, in a specific example, about 312 kDa.

In some examples, PAZAM and other forms of the acrylamide copolymer are linear polymers. In some other examples, PAZAM and other forms of the acrylamide copolymer are lightly cross-linked polymers.

In other examples, the polymeric hydrogel 22 may be a variation of structure (I). In one example, the acrylamide unit may be replaced with N,N-dimethylacrylamide

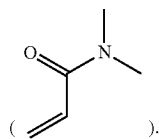

In this example, the acrylamide unit in structure (I) may be replaced with

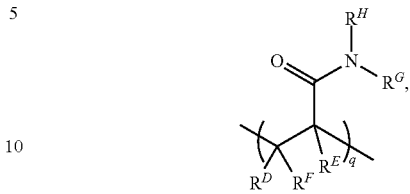

where $R^D$, $R^E$, and $R^F$ are each H or a C1-C6 alkyl, and $R^G$ and $R^H$ are each a C1-C6 alkyl (instead of H as is the case with the acrylamide). In this example, q may be an integer in the range of 1 to 100,000. In another example, the N,N-dimethylacrylamide may be used in addition to the acrylamide unit. In this example, structure (I) may include

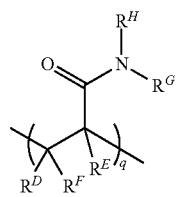

in addition to the recurring "n" and "m" features, where $R^D$, $R^E$, and $R^F$ are each H or a C1-C6 alkyl, and $R^G$ and $R^H$ are each a C1-C6 alkyl. In this example, q may be an integer in the range of 1 to 100,000.

As another example of the polymeric hydrogel 22, the recurring "n" feature in structure (I) may be replaced with a monomer including a heterocyclic azido group having structure (II):

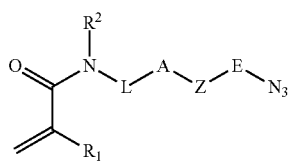

wherein $R^1$ is H or a C1-C6 alkyl; $R_2$ is H or a C1-C6 alkyl; L is a linker including a linear chain with 2 to 20 atoms selected from the group consisting of carbon, oxygen, and nitrogen and 10 optional substituents on the carbon and any nitrogen atoms in the chain; E is a linear chain including 1 to 4 atoms selected from the group consisting of carbon, oxygen and nitrogen, and optional substituents on the carbon and any nitrogen atoms in the chain; A is an N substituted amide with an H or a C1-C4 alkyl attached to the N; and Z is a nitrogen containing heterocycle. Examples of Z include 5 to 10 ring members present as a single cyclic structure or a fused structure. Some specific examples of Z include pyrrolidinyl, pyridinyl, or pyrimidinyl.

As still another example, the polymeric hydrogel 22 may include a recurring unit of each of structure (III) and (IV):

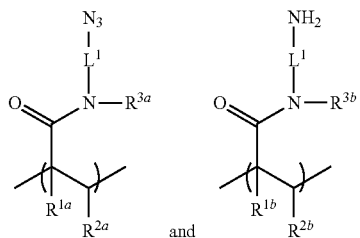

wherein each of $R^{1a}$, $R^{2a}$, $R^{1b}$ and $R^{2b}$ is independently selected from hydrogen, an optionally substituted alkyl or optionally substituted phenyl; each of $R^{3a}$ and $R^{3b}$ is independently selected from hydrogen, an optionally substituted alkyl, an optionally substituted phenyl, or an optionally substituted C7-C14 aralkyl; and each $L^1$ and $L^2$ is independently selected from an optionally substituted alkylene linker or an optionally substituted heteroalkylene linker.

It is to be understood that other molecules may be used to form the polymeric hydrogel 22, as long as they are functionalized to graft oligonucleotide primers 24, 26 thereto. Other examples of suitable polymer layers include those having a colloidal structure, such as agarose; or a polymer mesh structure, such as gelatin; or a cross-linked polymer structure, such as polyacrylamide polymers and copolymers, silane free acrylamide (SFA), or an azidolyzed version of SFA. Examples of suitable polyacrylamide polymers may be synthesized from acrylamide and an acrylic acid or an acrylic acid containing a vinyl group, or from monomers that form [2+2] photo-cycloaddition reactions. Still other examples of suitable polymeric hydrogels 22 include mixed copolymers of acrylamides and acrylates. A variety of polymer architectures containing acrylic monomers (e.g., acrylamides, acrylates etc.) may be utilized in the examples disclosed herein, such as branched polymers, including dendrimers (i.e., star polymers, star-block polymers), and the like. For example, the monomers (e.g., acrylamide, acrylamide containing the catalyst, etc.) may be incorporated, either randomly or in block, into the branches (arms) of a star-shaped polymer.

The polymeric hydrogel 22 may be deposited on the surface of the (pre-treated) cured, patterned resin 10' using spin coating, or dipping or dip coating, or flow under positive or negative pressure, or another suitable technique. The polymeric hydrogel 22 may be present in a mixture. In an example, the mixture includes PAZAM or a variation thereof in water or in an ethanol and water mixture.

After being coated, the polymeric hydrogel 22 may also be exposed to a curing process to form a coating of the polymeric hydrogel 22 across the entire patterned substrate (i.e., in depression(s) 18 and on interstitial region(s) 20). In an example, curing the polymeric hydrogel 22 may take place at a temperature ranging from room temperature (e.g., about 25° C.) to about 95° C. for a time ranging from about 1 millisecond to about several days. In another example, the time may range from 10 seconds to at least 24 hours. In still another example, the time may range from about 5 minutes to about 2 hours.

The attachment of the polymeric hydrogel 22 to the pre-treated depressions 18 and interstitial regions 20 may be through covalent bonding. The covalent linking of the polymeric hydrogel 22 to the silanized or plasma ashed depressions is helpful for maintaining the polymeric hydrogel 22 in the depressions 18 throughout the lifetime of the ultimately formed flow cell during a variety of uses. The following are some examples of reactions that can take place between the silane or silane derivative and the polymer hydrogel 22.

When the silane or silane derivative includes norbornene or a norbornene derivative as the unsaturated moiety, the norbornene or a norbornene derivative can: i) undergo a 1,3-dipolar cycloaddition reaction with an azide/azido group of PAZAM; ii) undergo a coupling reaction with a tetrazine group attached to PAZAM; undergo a cycloaddition reaction with a hydrazone group attached to PAZAM; undergo a photo-click reaction with a tetrazole group attached to PAZAM; or undergo a cycloaddition with a nitrile oxide group attached to PAZAM.

When the silane or silane derivative includes cyclooctyne or a cyclooctyne derivative as the unsaturated moiety, the cyclooctyne or cyclooctyne derivative can: i) undergo a strain-promoted azide-alkyne 1,3-cycloaddition (SPAAC) reaction with an azide/azido of PAZAM, or ii) undergo a strain-promoted alkyne-nitrile oxide cycloaddition reaction with a nitrile oxide group attached to PAZAM.

When the silane or silane derivative includes a bicyclononyne as the unsaturated moiety, the bicyclononyne can undergo similar SPAAC alkyne cycloaddition with azides or nitrile oxides attached to PAZAM due to the strain in the bicyclic ring system.

To form the polymeric hydrogel 22 in the depression(s) 18 and not on the interstitial region(s) 20 of the cured, patterned resin 10', the polymeric hydrogel 22 may be polished off of the interstitial regions 20. The polishing process may be performed with a gentle chemical slurry (including, e.g., an abrasive, a buffer, a chelating agent, a surfactant, and/or a dispersant) which can remove the polymeric hydrogel 22 from the interstitial regions 20 without deleteriously affecting the underlying cured, patterned resin 10' and/or substrate 12 at those regions. Alternatively, polishing may be performed with a solution that does not include the abrasive particles. The chemical slurry may be used in a chemical mechanical polishing system. In this example, polishing head(s)/pad(s) or other polishing tool(s) is/are capable of polishing the polymeric hydrogel 22 from the interstitial regions 20 while leaving the polymeric hydrogel 22 in the depressions 18 and leaving the underlying cured, patterned resin 10' at least substantially intact. As an example, the polishing head may be a Strasbaugh ViPRR II polishing head. In another example, polishing may be performed with a polishing pad and a solution without any abrasive. For example, the polish pad may be utilized with a solution free of the abrasive particle (e.g., a solution that does not include abrasive particles).

Polishing results in minimal to no scratching of and/or other damage to the cured, patterned resin 10'. This may be due to the increased hardness.

FIG. 3D depicts a flow cell surface precursor 30 after the polymeric hydrogel 22 has been applied to the depressions 18. The flow cell surface precursor 30 may be exposed to a cleaning process. This process may utilize a water bath and sonication. The water bath may be maintained at a relatively low temperature ranging from about 22° C. to about 30° C. The silanized, coated, and polished patterned substrate may also be spin dried, or dried via another suitable technique.

A grafting process is performed in order to graft primer(s) 24, 26 (e.g., two different primers 24, 26) to the polymeric hydrogel 22 in the depression(s) 18. The primers 24, 26 may be any forward amplification primer and/or reverse amplification primer. In this example, the primers 24, 26 are two different primers.

It is desirable for the primers 24, 26 to be immobilized to the polymeric hydrogel 22. In some examples, immobilization may be by single point covalent attachment to the polymeric hydrogel 22 at the 5' end of the respective primers 24, 26. Any suitable covalent attachment means known in the art may be used. In some examples, immobilization may be by strong non-covalent attachment.

Examples of terminated primers that may be used include an alkyne terminated primer, a tetrazine terminated primer, an azido terminated primer, an amino terminated primer, an epoxy or glycidyl terminated primer, a thiophosphate terminated primer, a thiol terminated primer, an aldehyde terminated primer, a hydrazine terminated primer, a phosphoramidite terminated primer, a triazolinedione terminated primer, and a biotin-terminated primer. In some specific examples, a succinimidyl (NHS) ester terminated primer may be reacted with an amine at a surface of the polymeric hydrogel 22, an aldehyde terminated primer may be reacted with a hydrazine at a surface of the polymeric hydrogel 22, or an alkyne terminated primer may be reacted with an azide at a surface of the polymeric hydrogel 22, or an azide terminated primer may be reacted with an alkyne or DBCO (dibenzocyclooctyne) at a surface of the polymeric hydrogel 22, or an amino terminated primer may be reacted with an activated carboxylate group or NHS ester at a surface of the polymeric hydrogel 22, or a thiol terminated primer may be reacted with an alkylating reactant (e.g., iodoacetamine or maleimide) at a surface of the polymeric hydrogel 22, a phosphoramidite terminated primer may be reacted with a thioether at a surface of the polymeric hydrogel 22, or a biotin-modified primer may be reacted with streptavidin at a surface of the polymeric hydrogel 22.

Each of the primers 24, 26 has a universal sequence for capture and/or amplification purposes. Examples of the primers 24, 26 include P5 and P7 primers, examples of which are used on the surface of commercial flow cells sold by Illumina Inc. for sequencing, for example, on HISEQ™, HISEQX™, MISEQ™, MISEQDX™, MINISEQ™, NEXTSEQ™, NEXTSEQDX™, NOVASEQ™, ISEQ™, GENOME ANALYZER™, and other instrument platforms.

For sequential paired end sequencing, each of these primers 24, 26 may also include a cleavage site. The cleavage sites of the primers 24, 26 may be different from each other so that cleavage of the primers 24, 26 does not take place at the same time. Examples of suitable cleavage sites include enzymatically cleavable nucleobases or chemically cleavable nucleobases, modified nucleobases, or linkers (e.g., between nucleobases). The enzymatically cleavable nucleobase may be susceptible to cleavage by reaction with a glycosylase and an endonuclease, or with an exonuclease. One specific example of the cleavable nucleobase is deoxyuracil (dU), which can be targeted by the USER enzyme. In an example, the uracil base may be incorporated at the $7^{th}$ base position from the 3' end of the P5 primer (P5U) or of the P7 primer (P7U). Other abasic sites may also be used. Examples of the chemically cleavable nucleobases, modified nucleobases, or linkers include 8-oxoguanine, a vicinal diol, a disulfide, a silane, an azobenzene, a photocleavable group, allyl T (a thymine nucleotide analog having an allyl functionality), allyl ethers, or an azido functional ether.

In an example, grafting may be accomplished by flow through deposition (e.g., using a temporarily bound lid), dunk coating, spray coating, puddle dispensing, or by another suitable method that will attach the primer(s) 24, 26 to the polymeric hydrogel 22. Each of these example techniques may utilize a primer solution or mixture, which may include the primer(s) 24, 26, water, a buffer, and a catalyst.

Dunk coating may involve submerging the flow cell surface precursor 30 (shown in FIG. 3D) into a series of temperature controlled baths. The baths may also be flow controlled and/or covered with a nitrogen blanket. The baths may include the primer solution or mixture. Throughout the various baths, the primer(s) 24, 26 will attach to the primer-grafting functional group(s) of the polymeric hydrogel 22 in at least some of the depression(s) 18. In an example, the flow cell surface precursor 30 will be introduced into a first bath including the primer solution or mixture where a reaction takes place to attach the primer(s) 24, 26, and then moved to additional baths for washing. Movement from bath to bath may involve a robotic arm or may be performed manually. A drying system may also be used in dunk coating.

Spray coating may be accomplished by spraying the primer solution or mixture directly onto the flow cell surface precursor 30. The spray coated wafer may be incubated for a time ranging from about 4 minutes to about 60 minutes at a temperature ranging from about 0° C. to about 70° C. After incubation, the primer solution or mixture may be diluted and removed using, for example, a spin coater.

Puddle dispensing may be performed according to a pool and spin off method, and thus may be accomplished with a spin coater. The primer solution or mixture may be applied (manually or via an automated process) to the flow cell surface precursor 30. The applied primer solution or mixture may be applied to or spread across the entire surface of the flow cell surface precursor 30. The primer coated flow cell surface precursor 30 may be incubated for a time ranging from about 2 minutes to about 60 minutes at a temperature ranging from about 0° C. to about 80° C. After incubation, the primer solution or mixture may be diluted and removed using, for example, the spin coater.

In other example, the primers 24, 26 may be pre-grafted to the polymeric hydrogel 22, and thus may be present in the depressions 18 once the polymeric hydrogel 22 is applied.

FIG. 3E and FIG. 3F illustrate an example of the flow cell surface 30' after primer grafting.

The examples shown in FIGS. 3E and 3F are examples of the flow cell surface 30' without a lid or other flow cell surface 30' bonded thereto. In an example, the lid may be bonded to at least a portion of the cured, patterned resin 10', e.g., at some of the interstitial regions 20 (e.g., those defining a perimeter of the substrate or a channel of the substrate). The bond that is formed between the lid and the cured, patterned resin 10' may be a chemical bond, or a mechanical bond (e.g., using a fastener, etc.).

The lid may be any material that is transparent to an excitation light that is directed toward the flow cell surface 30'. As examples, the lid may be glass (e.g., borosilicate, fused silica, etc.), plastic, or the like. A commercially available example of a suitable borosilicate glass is D 263®, available from Schott North America, Inc. Commercially available examples of suitable plastic materials, namely cyclo olefin polymers, are the ZEONOR® products available from Zeon Chemicals L.P.

The lid may be bonded to portion(s) of the interstitial regions 20 of the cured, patterned resin 10' using any suitable technique, such as laser bonding, diffusion bonding, anodic bonding, eutectic bonding, plasma activation bonding, glass frit bonding, or others methods known in the art. In an example, a spacer layer may be used to bond the lid to portion(s) of the interstitial regions 20 of the cured, patterned resin 10'. The spacer layer may be any material that will seal at least some of the cured, patterned resin 10' and the lid together. In some examples, the spacer layer can be a radiation-absorbing material that aids in bonding of the cured, patterned resin 10' and the lid.

In other examples, two of the flow cells surfaces 30' may be bonded together so that the depressions 18 (and the active surface chemistry therein) face a flow channel formed therebetween.

Methods for Using the Flow Cell

The flow cells disclosed herein may be used in a variety of sequencing approaches or technologies, including techniques often referred to as sequencing-by-synthesis (SBS), cyclic-array sequencing, sequencing-by-ligation, pyrosequencing, and so forth. With any of these techniques, since the polymeric hydrogel 22 and attached primer(s) 24, 26 are present in the depressions 18 and not on the interstitial regions 20, amplification will be confined to the depressions 18.

As one example, a sequencing by synthesis (SBS) reaction may be run on a system such as the HISEQ™, HISEQX™, MISEQ™, MISEQDX™, MINISEQ™, NOVASEQ™, ISEQ™, NEXTSEQDX™, or NEXTSEQ™ sequencer systems from Illumina (San Diego, Calif.). In SBS, extension of a nucleic acid primer (e.g., a sequencing primer) along a nucleic acid template (i.e., the sequencing template) is monitored to determine the sequence of nucleotides in the template. The underlying chemical process can be polymerization (e.g., catalyzed by a polymerase enzyme) or ligation (e.g., catalyzed by a ligase enzyme). In a particular polymerase-based SBS process, fluorescently labeled nucleotides are added to the sequencing primer (thereby extending the sequencing primer) in a template dependent fashion such that detection of the order and type of nucleotides added to the sequencing primer can be used to determine the sequence of the template.

Prior to sequencing, the capture and amplification primers 24, 26 can be exposed to a sequencing library, which is amplified using any suitable method, such as cluster generation.

In one example of cluster generation, the library fragments are copied from the hybridized primers 24, 26 by 3' extension using a high-fidelity DNA polymerase. The original library fragments are denatured, leaving the copies immobilized. Isothermal bridge amplification may be used to amplify the immobilized copies. For example, the copied templates loop over to hybridize to an adjacent, complementary primer 24, 26 and a polymerase copies the copied templates to form double stranded bridges, which are denatured to form two single stranded strands. These two strands loop over and hybridize to adjacent, complementary primers 24, 26 and are extended again to form two new double stranded loops. The process is repeated on each template copy by cycles of isothermal denaturation and amplification to create dense clonal clusters. Each cluster of double stranded bridges is denatured. In an example, the reverse strand is removed by specific base cleavage, leaving forward template polynucleotide strands. Clustering results in the formation of several template polynucleotide strands in each of the depressions 18. This example of clustering is bridge amplification, and is one example of the amplification that may be performed. It is to be understood that other amplification techniques may be used, such as the exclusion amplification (Examp) workflow (Illumina Inc.).

A sequencing primer may be introduced that hybridizes to a complementary sequence on the template polynucleotide strand. This sequencing primer renders the template polynucleotide strand ready for sequencing. The 3'-ends of the templates and any flow cell-bound primers 24, 26 (not attached to the copy) may be blocked to prevent interference with the sequencing reaction, and in particular, to prevent undesirable priming.

To initiate sequencing, an incorporation mix may be added to the flow cell. In one example, the incorporation mix includes a liquid carrier, a polymerase, and fluorescently labeled nucleotides. The fluorescently labeled nucleotides may include a 3' OH blocking group. When the incorporation mix is introduced into the flow cell, the fluid enters a flow channel and flows into the depressions 18 (where the template polynucleotide strands are present).

The fluorescently labeled nucleotides are added to the sequencing primer (thereby extending the sequencing primer) in a template dependent fashion such that detection of the order and type of nucleotides added to the sequencing primer can be used to determine the sequence of the template. More particularly, one of the nucleotides is incorporated, by a respective polymerase, into a nascent strand that extends the sequencing primer and that is complementary to the template polynucleotide strand. In other words, in at least some of the template polynucleotide strands across the flow cell surface(s) 30', respective polymerases extend the hybridized sequencing primer by one of the nucleotides in the incorporation mix.

The incorporation of the nucleotides can be detected through an imaging event. During an imaging event, an illumination system (not shown) may provide an excitation light to the flow cell surface(s) 30'.

In some examples, the nucleotides can further include a reversible termination property (e.g., the 3' OH blocking group) that terminates further primer extension once a nucleotide has been added to the sequencing primer. For example, a nucleotide analog having a reversible terminator moiety can be added to the sequencing primer such that subsequent extension cannot occur until a deblocking agent is delivered to remove the moiety. Thus, for examples that use reversible termination, a deblocking reagent can be delivered to the flow cell after detection occurs.

Wash(es) may take place between the various fluid delivery steps. The SBS cycle can then be repeated n times to extend the sequencing primer by n nucleotides, thereby detecting a sequence of length n.

In some examples, the forward strands may be sequenced and removed, and then reverse strands are constructed and sequenced as described herein.

While SBS has been described in detail, it is to be understood that the flow cells surface(s) 30' described herein may be utilized with other sequencing protocol, for genotyping, or in other chemical and/or biological applications.

While the examples described in FIG. 2 and FIG. 3A through FIG. 3F illustrate the use of the example resin compositions in the formation of a flow cell, it is to be understood that the resin compositions disclosed herein may be used in other applications where low autofluorescence is desired. As one example, the resin composition 10, and its corresponding cured resin 10', may be used in any optically-based SBS technique. As other examples, the resin composition 10, and its corresponding cured resin 10', may be used in planar waveguides, in complementary metal-oxide semiconductors (CMOS), etc.

To further illustrate the present disclosure, examples are given herein. It is to be understood that these example are provided for illustrative purposes and are not to be construed as limiting the scope of the present disclosure.

NON-LIMITING WORKING EXAMPLES

Example 1

An example resin (Ex. Resin 1) and two comparative example resins (Comp. Ex. Resin 2 and Comp. Ex. Resin 3) were prepared. The resin compositions (without liquid carrier) are provided in Table 1 below.

Each of the resin compositions included i) an epoxy resin matrix including glycidyl polyhedral oligomeric silsesquioxane and epoxycyclohexyl polyhedral oligomeric silsesquioxane monomers; and ii) a combination of a photoinitiator (PI) (namely, 2,2-Dimethoxy-2-phenylacetophenone) and a photoacid generator (PAG (namely Bis-4-methylphenyl)iodonium hexafluorophosphate). The resin compositions included different silica nanoparticles. The functionalized silica nanoparticles had acrylic surface functional groups, and had a particle size of either 10 nm or 20 nm. The non-functionalized silica nanoparticles were silicon dioxide without any surface functionality.

TABLE 1

| Sample ID | Epoxy resin matrix (mass %) | PAG (mass %) | PI (mass %) | Silica Nanoparticles (mass %) | | |
|---|---|---|---|---|---|---|
| | | | | Functionalized Particle Size 10 nm | Non-Functionalized Particle Size 10 nm | Functionalized Particle Size 20 nm |
| Ex. Resin 1 | 76.5 | 1.25 | 1.25 | 21 | — | — |
| Comp. Ex. Resin 2 | 76.5 | 1.25 | 1.25 | — | 21 | — |
| Comp. Ex. Resin 3 | 76.5 | 1.25 | 1.25 | — | — | 21 |

The resin compositions shown in Table 1 were each diluted with a solvent mixture containing about 97% PGMEA and about 3% DMSO to obtain resin compositions including about 18 mass % solids.

The diluted form of Ex. Resin 1 was a clear and substantially transparent solution, and was able to be spin coated and successfully imprinted.

The diluted form of Comp. Ex. Resin 2 was cloudy and non-transparent. The diluted form of Comp. Ex. Resin 2 was spin coated, but was not successfully imprinted. These results indicated that non-functionalized silica nanoparticles are not suitable for forming a nano-imprintable resin composition.

The diluted form of Comp. Ex. Resin 3 was also cloudy and non-transparent. The diluted form of Comp. Ex. Resin 3 was able to be spin coated but was not successfully imprinted. These results indicated that functionalized silica nanoparticles with particle size greater than 10 nm are not suitable for forming a nano-imprintable resin composition.

These results demonstrate that both the functionality and the particle size of the silica nanoparticles impacts whether the epoxy resin can be successfully imprinted.

Example 2

A control resin composition, two example resin compositions, and a comparative example resin composition were prepared.

Each of the resin compositions included i) an epoxy resin matrix including glycidyl polyhedral oligomeric silsesquioxane and epoxycyclohexyl polyhedral oligomeric silsesquioxane monomers; and ii) a combination of a photoinitiator (P1) (namely, 2,2-Dimethoxy-2-phenylacetophenone) and a photoacid generator (PAG (namely Bis-4-methylphenyl)iodonium hexafluorophosphate). The control resin composition included no functionalized silica nanoparticles. The example resin compositions included functionalized silica nanoparticles (particle size 10 nm) in different amounts within the range set forth herein. The comparative example resin composition included functionalized silica nanoparticles (particle size 10 nm) in an amount outside the range set forth herein. The resin compositions (without liquid carrier) are provided in Table 2.

TABLE 2

| Sample ID | Epoxy resin matrix (mass %) | PAG (mass %) | PI (mass %) | Functionalized SiO$_2$ Nanoparticles (mass%) |
|---|---|---|---|---|
| Control Resin 4 | 97.5 | 1.25 | 1.25 | 0 |
| Ex. Resin 5 | 85.5 | 1.25 | 1.25 | 12 |
| Ex. Resin 6 | 76.5 | 1.25 | 1.25 | 21 |
| Comp. Ex. Resin 7 | 55.5 | 1.25 | 1.25 | 42 |

The viscosity of each of the resin compositions shown in Table 2 was measured using an X-RITE™ viscometer at 25° C. The results are in shown in FIG. 4 (where the resins are identified by name and mass % functionalized silica nanoparticles). Control Resin 4 (without any functionalized silica nanoparticles) actually had the highest viscosity. The functionalized silica nanoparticles have minimal to no agglomeration, and thus do not increase the viscosity of the example and comparative example resin compositions. The viscosities of Ex. Resins 5 and 6 and of Comp. Ex. Resin 7 are within a suitable range for being deposited to a desirable layer thickness.

The resin compositions shown in Table 2 were each diluted with a solvent mixture containing about 97% PGMEA and about 3% DMSO to obtain resin compositions including about 18 mass % solids.

The diluted forms of each of Control Resin 4, Ex. Resins 5 and 6, and Comp. Resin 7 were spin coated on glass wafers and hand imprints were generated. The imprinted resin compositions were cured (using incident UV light at 365 nm) using different exposure times, including 5 seconds, 20 seconds, or 30 seconds. Throughout this discussion, the cured, imprinted resins are identified by the resin composition used to generate the cured resin.

Figure 5:
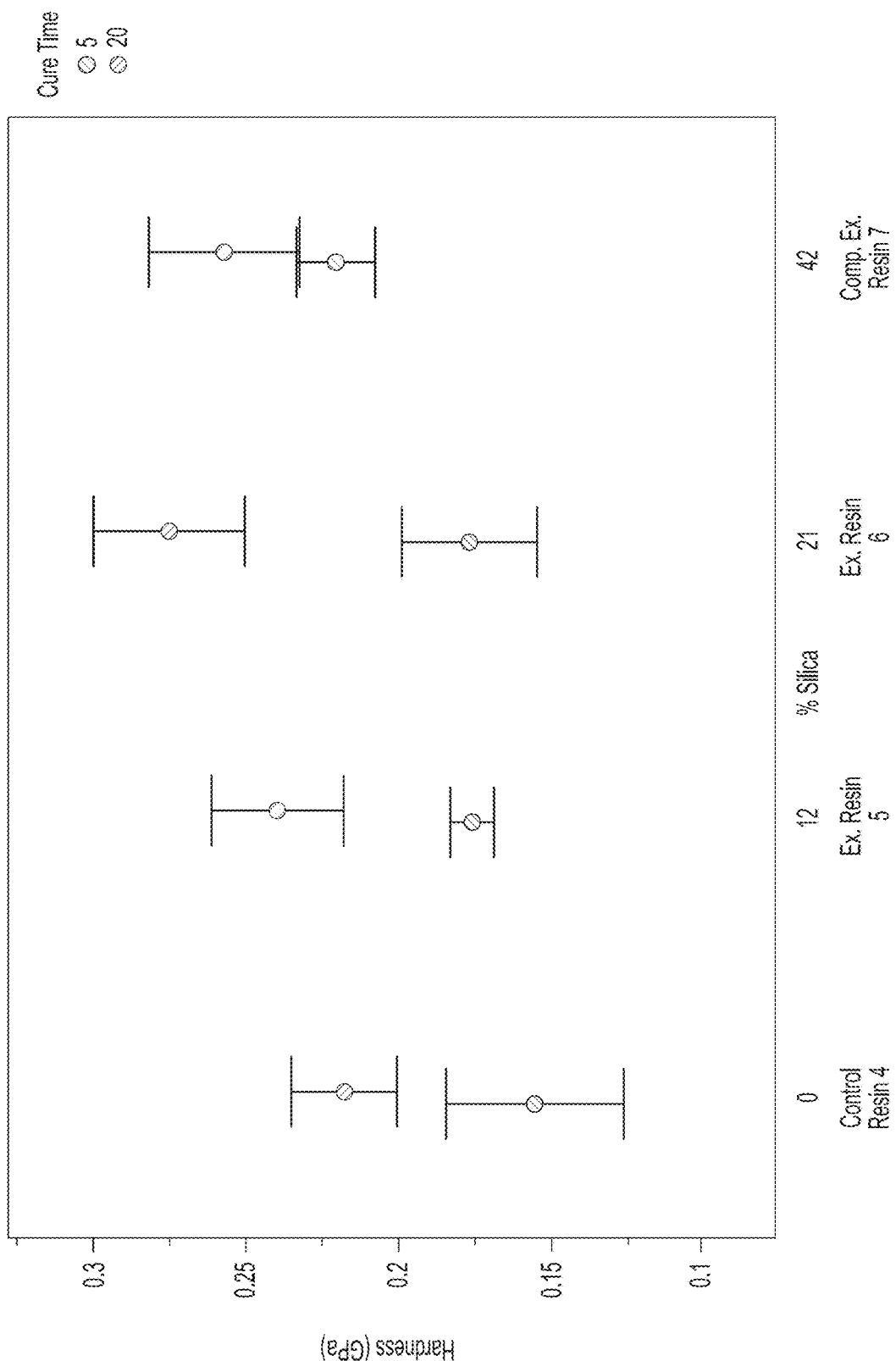
FIG. 5 is a graph depicting the hardness (GPa, Y axis) of cured resins versus the percentage of functionalized silica nanoparticles (mass % solids, X axis) in resin compositions used to form the cured resins.

Hardness measurements were taken for each of the cured, imprinted resins (Control Resin 4, Ex. Resins 5 and 6, and Comp. Resin 7) cured at 5 seconds and 20 seconds. The hardness measurements were taken using a nanoindentor, and the results are shown in FIG. 5. As depicted in FIG. 5, the hardness generally increased with increasing functionalized silica nanoparticle concentration, except for the Comp. Resin 7 cured at 20 seconds. The results for Comp. Resin 7 cured at 20 seconds indicate that the high amount of functionalized silica nanoparticles may be impeding the polymerization process. Ex. Resin 6 cured at 20 seconds had an approximately 30% increase in hardness compared to Control Resin 4 cured at 20 seconds.

Figure 6:
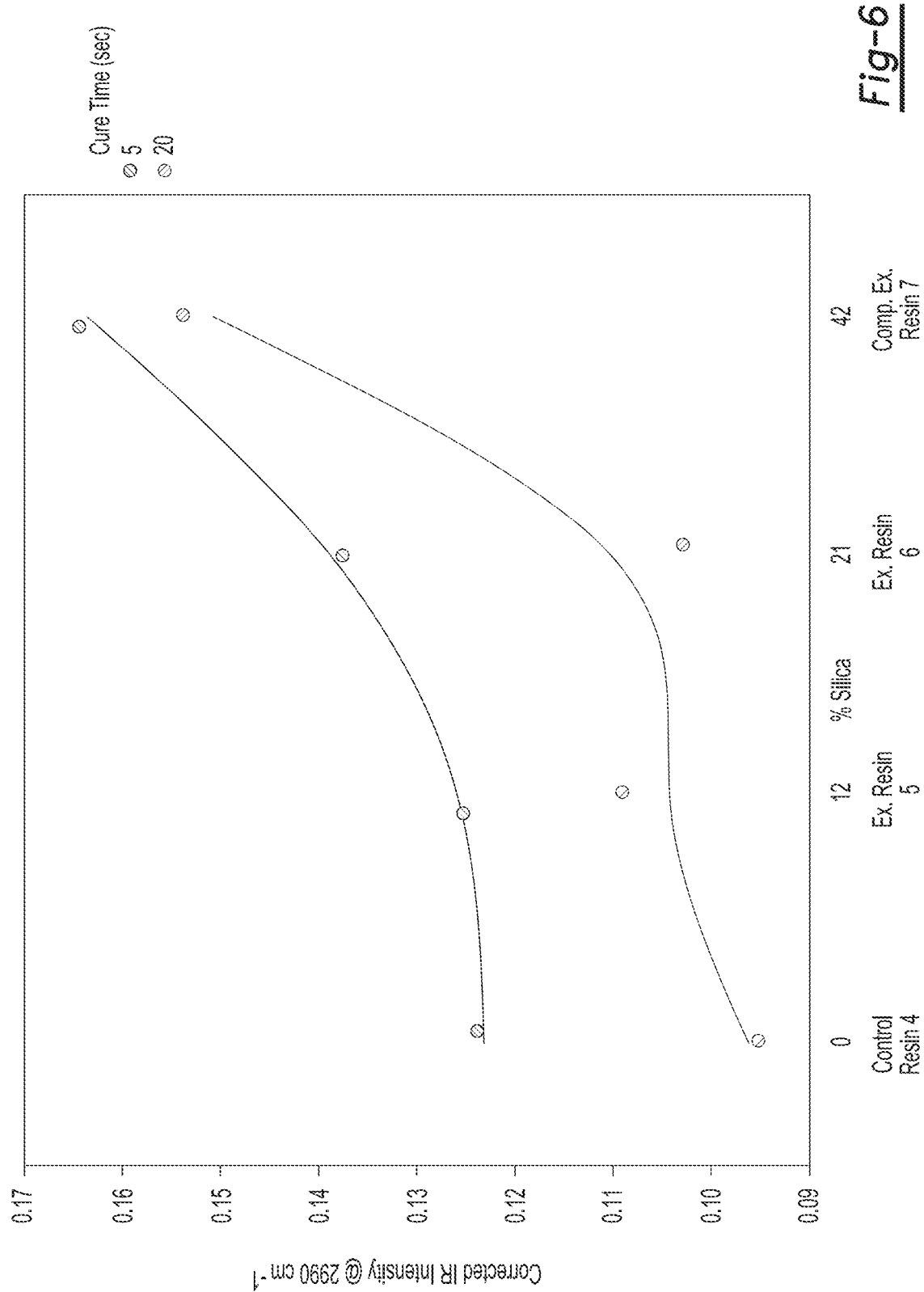
FIG. 6 is a graph depicting the corrected infrared (IR) intensity at 2990 cm-1 (Y axis) of cured resins (cured at two different UV cure times) versus the percentage of functionalized silica nanoparticles (mass % solids, X axis) in resin compositions used to form the cured resins.

The extent of cure of the cured, imprinted resins (cured at 5 seconds and 20 seconds) was assessed with FTIR. The results are shown in FIG. 6. The Y axis represents the corrected intensity at 2990 $cm^{-1}$, as there is a correlation between the intensity at this wavelength and the hardness of the resin, and thus the extent of cure of the epoxy monomers. A lower corrected intensity at 2990 $cm^{-1}$ corresponds to a higher extent of cure. The results shown in FIG. 6 indicate that the extent of resin cure is not affected significantly by loading up to 21 mass % of functionalized silica nanoparticles into the epoxy resin matrix. In contrast, a higher amount (e.g., the 42 mass % in Comp. Ex. Resin 7) may have impeded the polymerization process, resulting in less cured resins under the same curing conditions. The maximum amount of functionalized silica nanoparticles that may be included in the epoxy resin matrix disclosed herein without deleteriously affecting the extent of cure is about 35 mass % (e.g., 35.8 mass %).

Figure 7:
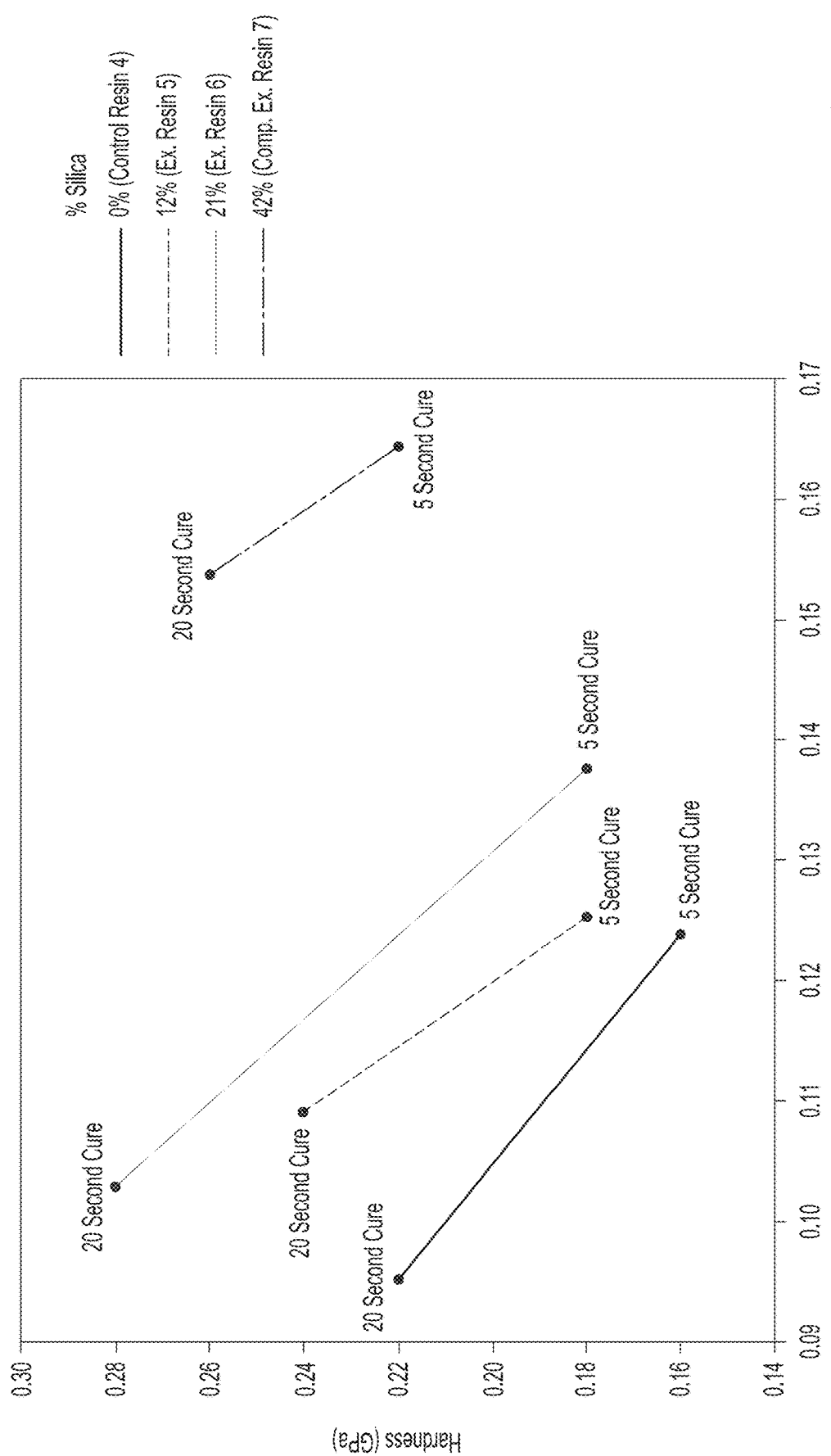
FIG. 7 is a graph depicting the hardness (GPa, Y axis) of cured resins (cured at two different UV cure times) versus the corrected infrared (IR) intensity at 2990 cm-1 (X axis) of the cured resins.

FIG. 7 plots the hardness results against the FTIR results for each of the cured, imprinted resins. The values at 20 second curing and 5 second curing are labeled. This graph illustrates that a higher curing time increases the hardness regardless of the amount of functionalized silica nanoparticles that is added. This graph also illustrates that 42% of functionalized silica nanoparticles undesirably increases the corrected IR intensity at 2990 $cm^{-1}$. The reduction in hardness of Comp. Ex. Resin 7 at 20 second cure (when compared to the results of Ex. Resin 6 at 20 second cure) indicates that the extent of cure is deleteriously affected when 42% of functionalized silica nanoparticles are included.

Figure 8:
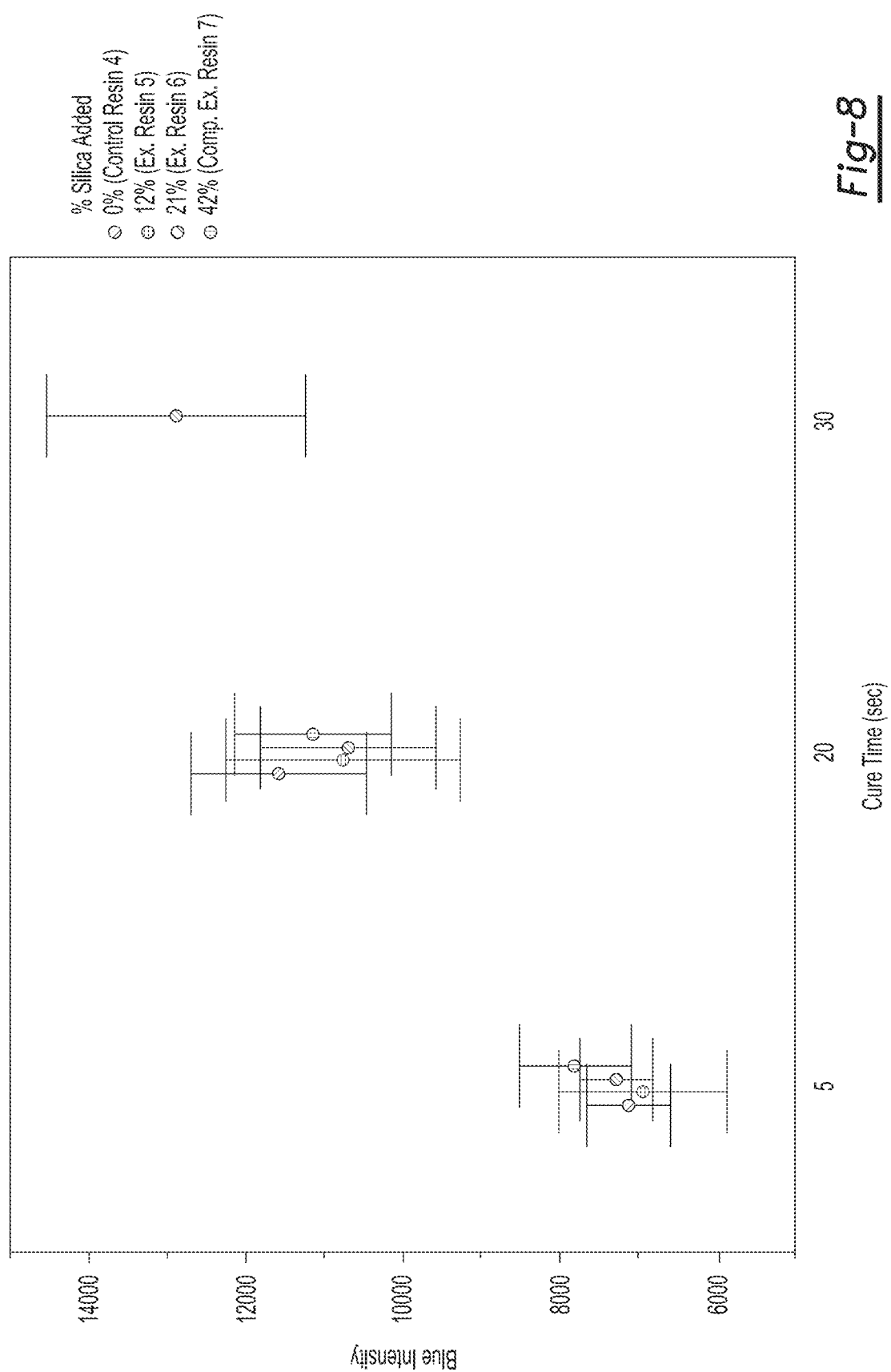
FIG. 8 is a graph depicting the autofluorescence (blue intensity, Y axis) versus UV cure time (in seconds, X axis) for cured resins.

The autofluorescence (AF) was measured for each of the cured, imprinted resins (cured at 5 seconds and 20 seconds) and for another imprint generated with Ex. Resin 6 cured at 30 seconds. The results are shown in FIG. 8. The Y-axis represents the blue fluorescence intensity (in arbitrary units, au). As shown in FIG. 8, the blue fluorescence intensity increased with increased cure times, regardless of the resin composition. The blue intensity for all resin compositions cured for 20 seconds and for 5 seconds was below 12,000, indicating that the addition of the functionalized silica nanoparticles does not deleteriously affect the autofluorescence. When the curing time of Ex. Resin 6 was increased to 30 seconds, the blue increased above 12,000. This indicates that resin compositions with a higher amount of the functionalized silica nanoparticles may perform better in terms of lower autofluorescence with lower curing times.

Figure 9:
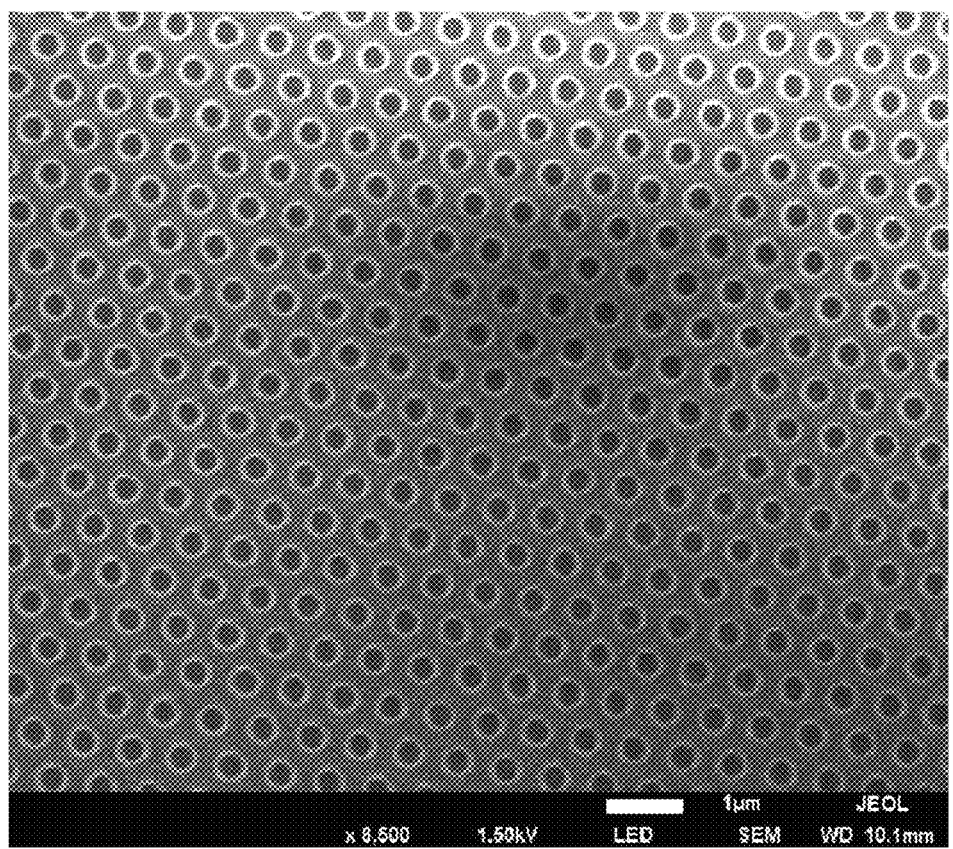
FIG. 9 is a scanning electron microscope (SEM) image depicting an example cured resin formed using an example of the resin composition disclosed herein and nanoimprint lithography.

A SEM image of a portion of the cured (for 20 seconds) imprint of Ex. Resin 6 is shown in FIG. 9. As depicted, the nano-sized features from the working stamp were successfully imprinted as depressions in the cured imprint. Quality measurements for depression depth, side wall angle, top diameter, etc. were also taken. The results are not reproduced herein, but were within the expected values for the master template that was used. The quality measurements indicate that the example resin can be patterned with high quality, fine features.

Additional Notes

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

Reference throughout the specification to "one example", "another example", "an example", and so forth, means that a particular element (e.g., feature, structure, and/or characteristic) described in connection with the example is included in at least one example described herein, and may or may not be present in other examples. In addition, it is to be understood that the described elements for any example may be combined in any suitable manner in the various examples unless the context clearly dictates otherwise.

It is to be understood that the ranges provided herein include the stated range and any value or sub-range within the stated range, as if such values or sub-ranges were explicitly recited. For example, a range of about 400 nm to about 1 µm (1000 nm), should be interpreted to include not only the explicitly recited limits of about 400 nm to about 1 µm, but also to include individual values, such as about 708 nm, about 945.5 nm, etc., and sub-ranges, such as from about 425 nm to about 825 nm, from about 550 nm to about 940 nm, etc. Furthermore, when "about" and/or "substantially" are/is utilized to describe a value, they are meant to encompass minor variations (up to +/−10%) from the stated value.

While several examples have been described in detail, it is to be understood that the disclosed examples may be modified. Therefore, the foregoing description is to be considered non-limiting.

What is claimed is:

1. A resin composition, comprising:
   an epoxy resin matrix including glycidyl polyhedral oligomeric silsesquioxane and epoxycyclohexyl polyhedral oligomeric silsesquioxane monomers;
   a photoacid generator;
   a photoinitiator; and
   from about 12 mass % to about 21 mass %, based on total solids in the resin composition, of functionalized silica nanoparticles incorporated into the epoxy resin matrix, the functionalized silica nanoparticles having an average particle size up to about 10 nm.

2. The resin composition as defined in claim 1, wherein the functionalized silica nanoparticles have surface functional groups, and the surface functional groups are acrylic functional groups.

3. The resin composition as defined in claim 1, wherein the functionalized silica nanoparticles are present in an amount of less than 20 mass %, based on total solids in the resin composition.

4. The resin composition as defined in claim 1, further comprising a liquid carrier.

5. A resin composition, comprising:
a liquid carrier; and
solids dispersed in the liquid carrier, the solids consisting of:
an epoxy material selected from the group consisting of an epoxy functionalized silsesquioxane, trimethylolpropane triglycidyl ether, tetrakis(epoxycyclohexyl ethyl)tetramethyl cyclotetrasiloxane, a copolymer of (epoxycyclohexylethyl)methylsiloxane and dimethylsiloxane, 1,3-bis [2-(3,4-epoxycyclohexyl) ethyl] tetramethyl disiloxane, 1,3-bis(glycidoxypropyl)tetramethyl disiloxane, 3,4-epoxycyclohexylmethyl-3,4-epoxycyclo-hexanecarboxylate, bis((3,4-epoxycyclohexyl)methyl) adipate, 4-vinyl-1-cyclohexene 1,2-epoxide, vinylcyclohexene dioxide, 4,5-epoxytetrahydrophthalic acid diglycidylester, 1,2-epoxy-3-phenoxypropane, glycidyl methacrylate, 1,2-epoxyhexadecane, poly(ethylene glycol) diglycidylether, pentaerythritol glycidyl ether, diglycidyl 1,2-cyclohexanedicarboxylate, tetrahydrophthalic acid diglycidyl ester, and combinations thereof;
functionalized silica nanoparticles;
an initiating system selected from the group consisting of a direct photoacid generator and a combination of a free radical photoinitiator and a photoacid generator; and
an optional surface additive.

6. The resin composition as defined in claim 5, wherein the functionalized silica nanoparticles have an average particle size up to about 10 nm.

7. The resin composition as defined in claim 5, wherein:
the epoxy material is present in an amount ranging from about 65 mass % to less than 100 mass %, based on total solids in the resin composition; and
the functionalized silica nanoparticles are present in an amount ranging from greater than 0 mass % up to about 35 mass %, based on the total solids in the resin composition.

8. The resin composition as defined in claim 5, wherein the functionalized silica nanoparticles have surface functional groups, and the surface functional groups are selected from the group consisting of acrylic functional groups, carboxy functional groups, amino functional groups, and combinations thereof.

9. A flow cell, comprising:
a substrate; and
a cured, patterned resin on the substrate, the cured, patterned resin including depressions separated by interstitial regions, and the cured, patterned resin including a cured form of a resin composition, the resin composition comprising:
a liquid carrier;
solids dispersed in the liquid carrier, the solids consisting of:
an epoxy material selected from the group consisting of an epoxy functionalized silsesquioxane, trimethylolpropane triglycidyl ether. tetrakis(epoxycyclohexyl ethyl)tetramethyl cyclotetrasiloxane, a copolymer of (epoxycyclohexylethyl)methylsiloxane and dimethylsiloxane, 1,3-bis[2-(3,4-epoxycyclohexyl) ethyl] tetramethyl disiloxane, 1,3-bis(glycidoxypropyl)tetramethyl disiloxane, 3,4-epoxycyclohexylmethyl-3,4-epoxycyclo-hexanecarboxylate, bis((3,4-epoxycyclohexyl)methyl) adipate, 4-vinyl-1-cyclohexene 1,2-epoxide, vinylcyclohexene dioxide, 4,5-epoxytetrahydrophthalic acid diglycidylester, 1,2-epoxy-3-phenoxypropane, glycidyl methacrylate, 1,2-epoxyhexadecane, poly(ethylene glycol) diglycidylether, pentaerythritol glycidyl ether, diglycidyl 1,2-cyclohexanedicarboxylate, tetrahydrophthalic acid diglycidyl ester, and combinations thereof;
an initiating system selected from the group consisting of a direct photoacid generator and a combination of a free radical photoinitiator and a photoacid generator; and
an optional surface additive; and
functionalized silica nanoparticles incorporated into the epoxy resin matrix, the functionalized silica nanoparticles having an average particle size up to about 10 nm.

10. The flow cell as defined in claim 9, further comprising:
a hydrogel in the depressions; and
amplification primers attached to the hydrogel.

11. The flow cell as defined in claim 9, wherein the functionalized silica nanoparticles have surface functional groups, and the surface functional groups are selected from the group consisting of acrylic functional groups, carboxy functional groups, amino functional groups, and combinations thereof.

12. A method, comprising:
mixing an epoxy resin matrix and a liquid carrier to form a mixture;
incorporating functionalized silica nanoparticles having an average particle size up to about 10 nm into the mixture, thereby forming a diluted resin composition, wherein the functionalized silica nanoparticles are present in an amount ranging from greater than 0 mass % up to about 35 mass %, based on total solids in the diluted resin composition;
applying the diluted resin composition on a substrate, whereby at least some of the liquid carrier evaporates to form a nanoimprintable resin composition;
imprinting the nanoimprintable resin composition with a working stamp having a plurality of nanofeatures; and
curing the nanoimprintable resin composition while the working stamp is in place, thereby forming a cured, patterned resin on the substrate.

13. The method as defined in claim 12, wherein the functionalized silica nanoparticles have surface functional groups, and the surface functional groups are selected from the group consisting of acrylic functional groups, carboxy functional groups, amino functional groups, and combinations thereof.

14. The method as defined in claim 12, wherein the epoxy resin matrix comprises an epoxy material selected from the group consisting of an epoxy functionalized silsesquioxane; trimethylolpropane triglycidyl ether; tetrakis(epoxycyclohexyl ethyl)tetramethyl cyclotetrasiloxane; a copolymer of (epoxycyclohexylethyl)methylsiloxane and dimethylsiloxane; 1,3-bis[2-(3,4-epoxycyclohexyl) ethyl]tetramethyl disiloxane; 1,3-bis(glycidoxypropyl)tetramethyl disiloxane; 3,4-epoxycyclohexylmethyl-3,4-epoxycyclo-hexanecarboxylate; bis((3,4-epoxycyclohexyl)methyl) adipate; 4-vinyl-1-cyclohexene 1,2-epoxide; vinylcyclohexene dioxide; 4,5-epoxytetrahydrophthalic acid diglycidylester; 1,2-epoxy-3-phenoxypropane; glycidyl methacrylate; 1,2-epoxyhexadecane; poly(ethylene glycol) diglycidylether; pentaerythritol glycidyl ether; diglycidyl 1,2- cyclohexanedicarboxylate; tetrahydrophthalic acid diglycidyl ester; and combinations thereof.

15. The resin composition as defined in claim 1, wherein the resin composition includes:
  76.5 mass % of the epoxy resin matrix;
  1.25 mass % of the photoacid generator, and
  1.25 mass % of a photoinitiator.

\* \* \* \* \*